United States Patent
Sardi et al.

(10) Patent No.: US 7,069,458 B1
(45) Date of Patent: Jun. 27, 2006

(54) PARALLEL DATA INTERFACE AND METHOD FOR HIGH-SPEED TIMING ADJUSTMENT

(75) Inventors: Mohamed Sardi, Santa Clara, CA (US); Gabriel M. Li, San Francisco, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 585 days.

(21) Appl. No.: 10/222,129

(22) Filed: Aug. 16, 2002

(51) Int. Cl.
*G06F 13/42* (2006.01)

(52) U.S. Cl. ............ 713/401; 327/152; 327/295; 714/744

(58) Field of Classification Search ........... 327/152, 327/295; 375/371, 356; 713/401, 503; 714/744
See application file for complete search history.

(56) References Cited

U.S. PATENT DOCUMENTS

| | | | |
|---|---|---|---|
| 5,621,774 A * | 4/1997 | Ishibashi et al. | 375/371 |
| 6,105,144 A * | 8/2000 | Wu | 713/401 |
| 6,137,336 A * | 10/2000 | Baba et al. | 327/295 |
| 6,502,212 B1 * | 12/2002 | Coyle et al. | 714/43 |
| 6,775,339 B1 * | 8/2004 | Wildes et al. | 375/354 |

* cited by examiner

*Primary Examiner*—Thomas Lee
*Assistant Examiner*—Albert Wang
(74) *Attorney, Agent, or Firm*—Kevin L. Daffer; Daffer McDaniel, LLP

(57) ABSTRACT

A parallel data interface and method is provided herein, which adjusts a timing relationship of a clock signal to not only minimize clock skew, but to also compensate for noise components that may affect one or more paths of a parallel data bus. In some embodiments, the parallel data interface includes a first phase generator coupled to generate a first plurality of time delay pulses, and a first phase selector adapted to select one of the first plurality of time delay pulses to adjust the timing of a clock signal to sample each and every one of the plurality of data signals between minimum setup and hold time thresholds. In some embodiments, the parallel data interface includes a second phase generator coupled to generate a second plurality of time delay pulses, and a second phase selector adapted to select one of the second plurality of time delay pulses to adjust the timing of the clock signal to output the plurality of data signals from the data interface at least an amount of time (i.e., an access time) after the adjusted clock transition is output from the data interface.

13 Claims, 7 Drawing Sheets

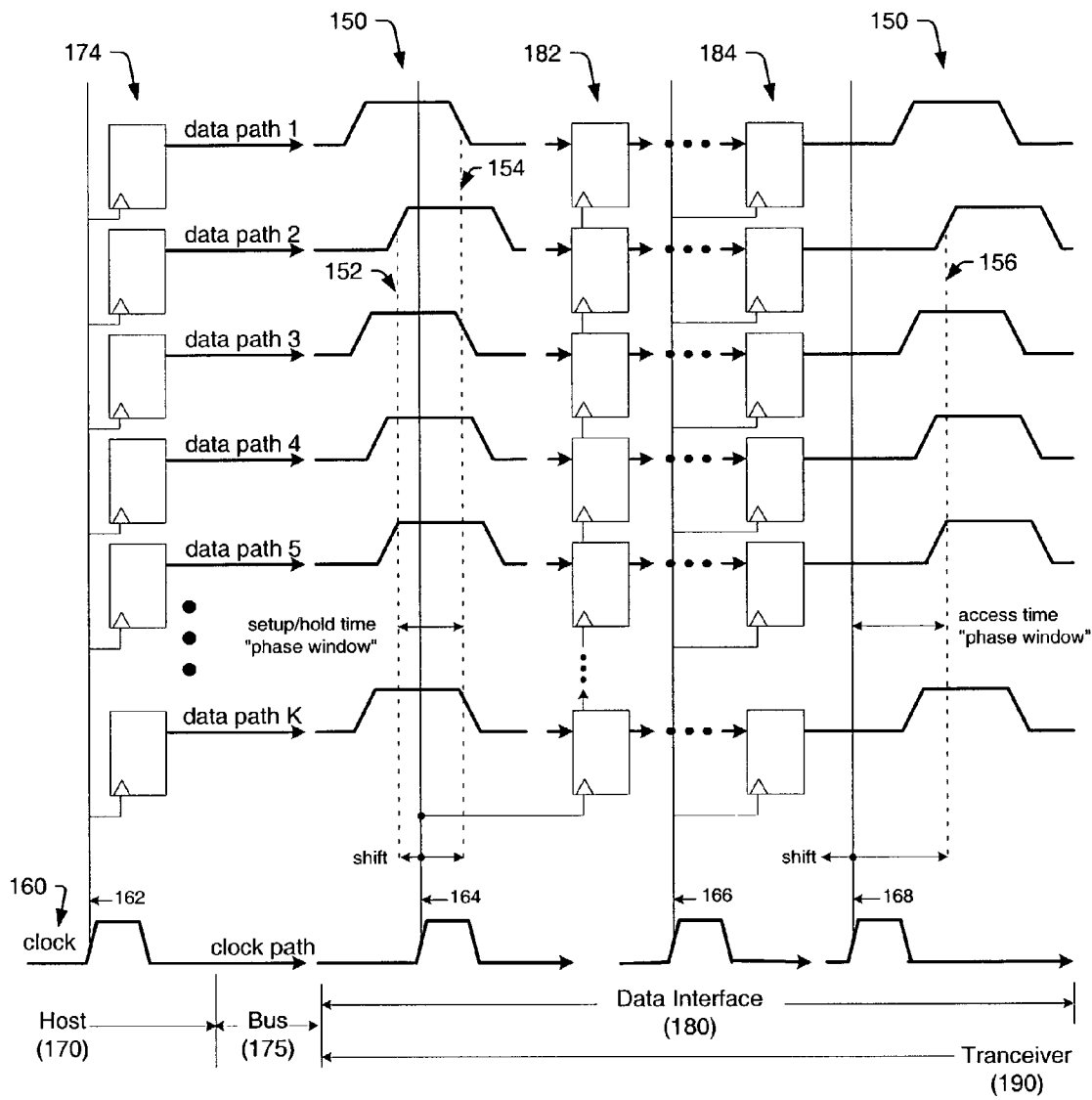
FIG. 11A
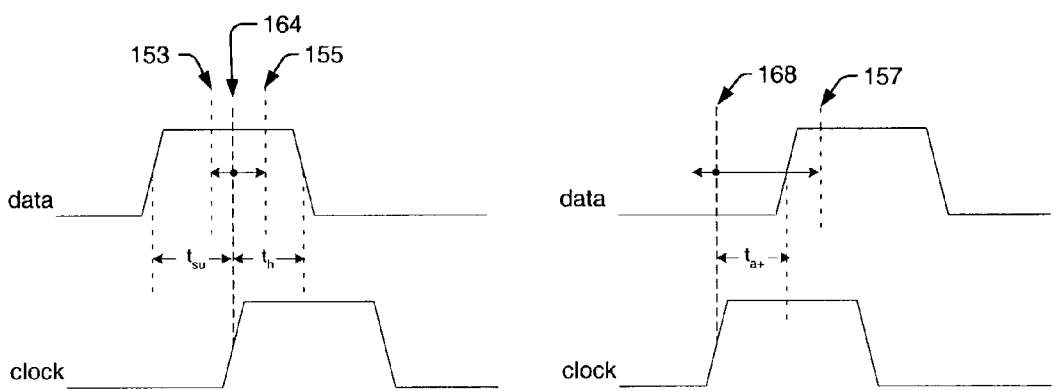
FIG. 11B
FIG. 11C

PARALLEL DATA INTERFACE AND METHOD FOR HIGH-SPEED TIMING ADJUSTMENT

BACKGROUND OF THE INVENTION

1. Field of the Invention

This invention relates to a data interface that receives a plurality of data signals from a parallel bus, and accurately samples each and every one of the data signals having dissimilar transition times between transitions of a clock signal. As such, the data interface is adapted to adjust a timing relationship between a clock signal and the plurality of data signals with a relative amount of phase delay imparted to the clock signal. The data interface may be included within a synchronous device or, more particularly, within a communications system or network to receive and/or transmit the plurality of data signals over a parallel data bus.

2. Description of the Related Art

The following descriptions and examples are given as background only.

A synchronous device is a device in which data may be transferred from one edge-sensitive element to another in response to an active transition of a clock signal. Similarly, a synchronous system may be defined as a system in which data is transferred from one synchronous device (e.g., a transmitter) to another synchronous device (e.g., a receiver) in response to a clock transition. In some cases, data may be transferred in a single direction from transmitter to receiver over an internal or external bus. In other cases, however, data transfer may be bi-directional. In such a case, a first synchronous device may be referred to as a host, while a second synchronous device may be referred to as a transceiver. In any case, the clock signal may be transferred along with the data signal from transmitting to receiving portions of the synchronous system.

In order to successfully implement a synchronous system, it is beneficial to properly align the clock signal to the data being sampled at the input latches of the receiving portion of the system. Such alignment often entails ensuring the data transition occurs at the proper moment between the edges or active transitions of the clock signal. Synchronous systems, therefore, rely on data transitioning and remaining stable from a time at least a "setup time" before a clock transition until at least a "hold time" after the clock transition. For example, FIG. 1 illustrates a data signal that is stable for a setup time, $t_{su}$, before the active edge of the clock signal. In addition, FIG. 1 illustrates the data signal remaining stable for a hold time, $t_h$, after the active edge of the clock signal. In some cases, circuit elements of the receiving portion may be coupled to receive the data signal after it is sampled at the clock transition. These circuit elements may rely on the sampled data transitioning at least an amount of time, $t_{a+}$, after a clock transition as illustrated in FIG. 2. Such an amount of time may represent the length of time in which circuit elements of the receiving portion wait to receive the sampled data signal after receiving the sample clock transition. In some cases, the amount of time is comparable to the propagation delay through output latches of the data interface within the receiving portion. Thus, the amount of time, $t_{a+}$, maybe generally referred to as "clock to output Q time" or positive "access time."

Most synchronous systems have stringent setup, hold, and access timing requirements, which are typically specified by a manufacturer of the system. In addition, the margin of time in which a clock transition can sample a data signal between data setup and hold times generally decreases as the clock transition frequency increases (i.e., as operation speed increases). As such, high-speed synchronous systems usually cannot afford significant skewing of the clock signal relative to data signal transitions. In general, clock skew may be described as a variation in the arrival times between two signals, which are specified to occur at the same time. Because clock signals are used to drive many of the components within synchronous systems, any variation in the arrival of a clock transition may significantly impact system performance and/or reliability.

In some cases, clock skew significantly affects the timing margins of synchronous systems, such as setup, hold, and access time margins, by decreasing the predictability of the arrival of a clock transition. For example, edge-sensitive flip-flops may be used to sample incoming data signals. In such an example, a flip-flop may successfully latch a data signal if the data signal is stable during critical setup and hold periods on either side of the clock transition. In some cases, however, clock skew may shift the clock transition sufficiently in time to cause a bit error to occur when the data is sampled. A bit error, as described herein, is a sampling error that occurs when a clock transition incorrectly samples a data signal. In other words, a logic value of a data signal output from a latch may not equal a logic value of the data signal input to the latch.

In addition, clock skew may reduce the cycle time within which information can be passed from one device to the next. As system speeds increase, clock skew may become an increasingly large portion of the total cycle time. When cycle times were 50 ns, for example, clock skew could occupy as much as 20% of the cycle time without degrading system performance. In high-speed systems having cycle times approaching 15 ns or less, however, only 10% of the timing budget may be allocated to clock skew. If clock skew exceeds such an allocated amount, the system will most likely perform unreliably.

Although numerous techniques are used in an effort to minimize clock skew, most techniques cannot in all conditions ensure a data signal transition occurs at the critical moment between clock signal edges. In some cases, an external component may be added to the clock path in an effort to minimize clock skew. In such a case, the external component may add a fixed amount of time delay to the clock path in an attempt to align the clock transition within the data timing margins of the receiving synchronous device.

FIG. 3 illustrates external component 5, which may include, for example, one or more buffers, a programmable logic device (PLD), or an application specific integrated circuit (ASIC). In one example, a matrix of buffers may include a plurality of parallel lines, each of which include a different number of buffers. In this manner, each of the plurality of parallel lines is adapted to impart a different amount of delay at its output. As such, the matrix of buffers may be used (in conjunction with a line selecting device, such as a multiplexer) to add a slightly variable amount of delay to the clock path. The selection of delay amounts, however, is undesirably fixed by the circuit design and cannot be changed by the user. In another example, a programmable logic device (PLD) generally includes combinational and/or sequential logic, which can be defined by the user and programmed into the device. As such, a PLD may be programmed to provide a variable amount of delay to the clock path. A PLD, however, generally exhibits low operating speeds, such as operating speeds of 150 MHz or below. As such, a PLD may not be fast enough to accommodate high-speed synchronous systems having operating speeds substantially greater than 150 MHz. An application specific integrated circuit (ASIC), on the other hand, may provide a variable amount of delay to the clock path at possibly higher operating speeds than a PLD. ASICs, however, are typically very expensive and their performance is often highly sensitive to any impedance mismatches at the inputs and outputs of the device. In addition, adding any external component tends to undesirably increase the financial cost, power, and area consumed by the synchronous system.

Alternatively, FIG. 4 illustrates an internal data interface 10, which may be included within a synchronous system. Internal data interface 10 may use a phase-locked loop (PLL) or delay-locked loop (DLL) device to add a substantially consistent amount of delay to the clock path. Generally, a PLL is a closed-loop device that uses a voltage-controlled oscillator (VCO) to obtain accurate phase and frequency alignment between a feedback clock signal and a reference clock signal. A DLL device, on the other hand, differs from a PLL device in that it generally uses a delay line instead of a VCO to obtain accurate phase alignment between the feedback clock signal and the reference clock signal.

In some cases, a PLL or DLL device (reference numeral 12) may be used to add a substantially consistent amount of delay to the clock path, which adjusts the active edge of the clock signal before clocking input latch 14 of data interface 10. As such, PLL/DLL device 12 may be used to reduce clock skew by adjusting the timing of the clock signal to occur within the data setup and hold time requirements of a transmitting portion of the synchronous system. Buffer device 16 may be included within the clock path to account for the propagation delay added to the data path by latch 14. In addition, another PLL or DLL device (reference numeral 22) may be used to add another amount of delay to the clock path, which adjusts the active edge of the clock signal after clocking output latch 20 of data interface 10. In this manner, PLL/DLL device 22 may be used to reduce clock skew by adjusting the timing of the clock signal to occur after at least a data access time requirement of a receiving portion of the synchronous system. Similar to buffer device 16, buffer device 18 may be included within the clock path to account for propagation delays, which may be added to the data path by circuit elements arranged between input latch 14 and output latch 20.

One disadvantage of internal data interface 10, however, is that the amount of delay imparted to the clock path is undesirably fixed by the circuit design. As stated above, the margin of time in which a clock transition can sample a data transition between data setup and hold times decreases proportionally as the frequency of the clock transition increases. In this manner, a fixed delay may fall further outside of such a timing margin as the frequency of the clock transition increases. Thus, a delay error tolerance of data interface 10 may decrease as operating speeds increase.

In addition, though internal data interface 10 provides a substantially consistent amount of clock path delay, it does not guarantee that the timing along the data path is correct. In a synchronous system, for example, which utilizes a parallel data bus (i.e., a plurality of parallel data paths) to transfer data between transmitting and receiving portions, interference between individual paths of the parallel data bus may introduce an unpredictable amount of delay to one or more of the individual paths. As such, even though internal data interface 10 may reduce the affects of clock skew, interference within the parallel data bus may skew the data signals separate from one another thereby causing one or more of the data signals to be sampled incorrectly.

Therefore, it would be beneficial to provide an improved data interface for a synchronous system. Such an improved data interface would preferably reduce the affects of data path interference in addition to reducing the affects of clock skew. Furthermore, the improved data interface would operate at high or low operating speeds without compromising data integrity. Moreover, the improved data interface would consume substantially less power and area, and cost less than conventional solutions.

SUMMARY OF THE INVENTION

The problems outlined above may be in large part addressed by a parallel data interface that adjusts a timing relationship of a clock signal to not only minimize clock skew, but to also compensate for noise components, such as data skew and jitter, which may affect one or more paths of a parallel data bus. In this manner, a plurality of data signals having dissimilar transition times can be accurately sampled by adjusting a clock transition to occur at a time that best suits substantially all of the plurality of data signals. As such, the data interface provides error-free data transmission regardless of unpredictable timing delays along the clock and/or data paths. In general, such a data interface may be included within transmitting and/or receiving portions of any synchronous system.

In some embodiments, the parallel data interface preferably includes a first phase generator coupled to generate a first plurality of time delay pulses. In addition, the parallel data interface preferably includes a first phase selector coupled to select one of the first plurality of time delay pulses (i.e., a "best phase") to adjust the timing of a clock signal to accurately sample each and every one of the plurality of data signals of the parallel data bus. In other words, the parallel data interface is adapted to temporally shift a transition of the clock signal by the select one of the first plurality of time delay pulses to sample each and every one of the plurality of data signals without the occurrence of a bit error.

Furthermore, the first phase selector of the parallel data interface preferably includes a first control signal generator adapted to provide a control signal to select the "best phase" time delay pulse. In some cases, the first control signal generator is adapted to provide a control signal having an adjustable number of bits, which determines the number of time delay pulses generated by the first phase generator, as well as a time difference between neighboring time delay pulses. Therefore, based upon control signals provided by the first control signal generator, the phase generator is adapted to generate an adjustable number of time delay pulses that are separated by an adjustable phase increment. Thus, the parallel data interface is adapted to temporally shift the clock transition by a highly adjustable and carefully selected amount of time delay to compensate for noise components, such as data skew and jitter, which may affect one or more paths of the parallel data bus.

Moreover, the parallel data interface preferably includes a test access port coupled to the control signal generator. In some cases, the test access port may be a serial port including at least one input pin of the data interface. In other cases, however, the test access port may be a parallel port including a plurality of input pins of the data interface. In any case, the test access port generally includes a number of input pins substantially less than the number of phases generated by the phase generator. In addition, calibration signals input to the test access port may enable the control signal generator to begin a calibration process, or alternatively, to provide previously calibrated control signals to the phase generator. In the latter case, previously calibrated control signals result from hardwiring a "best phase" control signal after performing a previous calibration process to characterize a timing relationship between signals traversing a clock path and each and every one of the paths of the parallel data bus. Preferably, the hardwired control signal is implemented with re-programmable circuit elements, which advantageously reduces the overall power consumed by the data interface while providing the user with flexibility in tailoring the data interface to one or more specific applications.

The parallel data interface preferably includes an input latch coupled to receive a clock transition adjusted by the select one of the first plurality of time delay pulses for sampling each and every one of a plurality of data signals input to the latch. In addition, the parallel data interface may include error detection circuitry adapted to provide an error signal to an output pin of the data interface, in some cases. Such an error signal may be provided when a logic value of at least one of the plurality of data signals output from the latch does not equal a logic value of the respective data signals input to the latch.

In some cases, the control signal generator may be adapted to sequentially select each one of the first plurality of time delay pulses until a select one of the first plurality of time delay pulses does not cause the error detection circuitry to produce an error signal. In other cases, however, the control signal generator may be adapted to programmably select a different one of the first plurality of time delay pulses until a select one of the first plurality of time delay pulses does not cause the error detection circuitry to produce an error signal. In any case, the select one of the first plurality of time delay pulses adjusts the timing of the clock transition in such a manner that each and every one of the plurality of data signals are accurately sampled after a setup time threshold and before a hold time threshold. In other words, the timing of the clock transition is adjusted by a first "best phase" amount of time delay to ensure that each and every one of the plurality of data signals are sampled having at least a minimum setup time before the adjusted clock transition and at least a minimum hold time after the adjusted clock transition. In general, the setup and hold times of the plurality of data signals are within specification values of a transmitting portion of the synchronous system.

In some embodiments, the parallel data interface preferably includes a second phase generator coupled to generate a second plurality of time delay pulses and a second control signal generator coupled to modify a number of the time delay pulses and a time difference between neighboring time delay pulses output from the second phase generator. In addition, the parallel data interface preferably includes a plurality of data output pins coupled to receive the plurality of data signals from an output latch of the data interface. In such an embodiment, the second control signal generator is adapted to select, one at a time, a different one of the second plurality of time delay pulses to be applied to a clock output pin of the data interface.

In some cases, a time difference is measured between a transition of the different one of the second plurality of time delay pulses (from the clock output pin) and a transition of at least one of the plurality of data signals (from at least one of the plurality of data output pins). The time difference determines a select one of the second plurality of time delay pulses (i.e., a "best phase") to adjust the timing of a clock transition coupled to the clock output pin, such that each and every one of the plurality of data signals arrives at respective data output pins after at least an access time threshold. In other words, the timing of the clock transition is adjusted by a second "best phase" amount of time delay to ensure that the plurality of data signals are output from the data interface an amount of time after the adjusted clock transition is output from the data interface. In general, the amount of time refers to an access time specification of a receiving portion of the synchronous system.

In addition, a method for adjusting a timing relationship between a clock transition and a plurality of data signals input to a parallel data interface is provided herein. In some cases, the method includes applying a select one of a first plurality of time delay pulses to a clock path of the data interface prior to clocking an input latch of the data interface. In some cases, the method includes applying a select one of a second plurality of time delay pulses to the clock path subsequent to clocking an output latch of the data interface. In addition, the method includes applying a signal to an input pin of the data interface to select between predetermined control values and control values output from a control signal generator.

BRIEF DESCRIPTION OF THE DRAWINGS

Other objects and advantages of the invention will become apparent upon reading the following detailed description and upon reference to the accompanying drawings in which:

FIG. 11A is a timing diagram illustrating one embodiment of a method for adjusting a timing relationship between a clock transition and a plurality of data signals input to a parallel data interface, as depicted in FIGS. 5 and 10;

FIG. 11B is a timing diagram illustrating minimum setup and hold time thresholds of a data signal relative to an active transition of an adjustable clock transition;

FIG. 11C is a timing diagram illustrating a minimum access time threshold of a data signal relative to an active transition of an adjustable clock transition;

Figure 1:
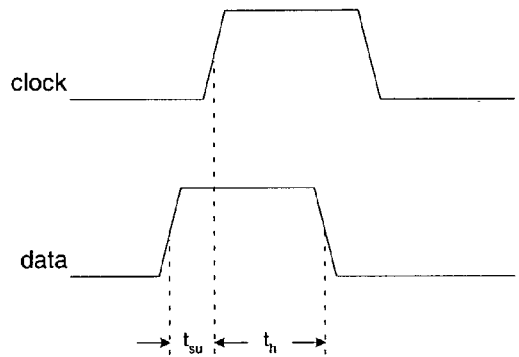
FIG. 1 is a timing diagram illustrating setup and hold times of a data signal relative to an active transition of a clock signal.
Figure 2:
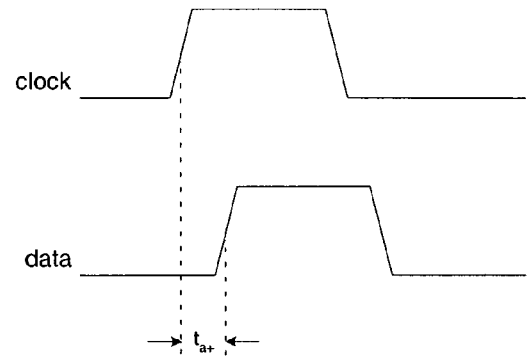
FIG. 2 is a timing diagram illustrating a positive access time of a data signal relative to an active transition of a clock signal.
Figure 3:
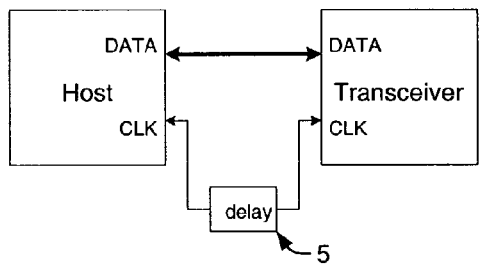
FIG. 3 is a block diagram illustrating an external component coupled to a clock path between transmitting and receiving portions of a synchronous system.
Figure 4:
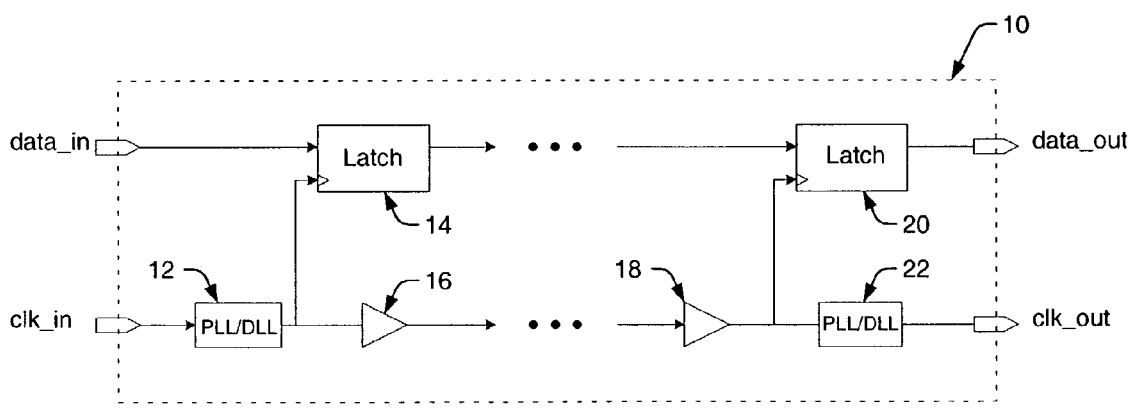
FIG. 4 is a block diagram illustrating an internal data interface coupled to a data path and clock path within one or more portions of a synchronous system.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Error-free data transmission is typically a major design goal for any synchronous system. In high-speed synchronous systems that transmit data over a parallel bus, however, several factors may interfere with obtaining such a design goal. In addition to clock skew, random noise induced within the parallel data bus may adversely effect data transmission. For example, bit errors may result if a sufficient amount of noise is induced within the data bus when the data signal is sampled. In general, noise may be induced in the form of data skew and/or jitter within one or more paths of the parallel data bus. Although they are often caused by similar sources, distinct differences exist between data skew and jitter.

Data skew is often defined by variations between one data path and another. For example, individual paths of a parallel data bus are generally routed within close proximity to each other. As such, signals traversing a given data path may be adversely affected by noise, in the form of electromagnetic interference (EMI), for example, from one or more of the other data paths. Such interference is generally referred to as "cross-talk" and often leads to skewing of the data signal. Unfortunately, the amount and direction by which the data signal is skewed (i.e., temporally shifted by a positive or negative amount) depends on more than one factor and is often extremely hard, if not impossible, to predict. For example, the induced data skew may depend on the physical differences between the parallel data paths, such as trace length mismatches, capacitive loading, etc. In addition, the induced data skew may depend on the operating speed of the system, and in some cases, data skew may increase as operating speeds increase.

Jitter, on the other hand, applies only to an individual data path of the parallel bus and generally results from time-varying components of noise sources. Jitter is often defined as the cycle-to-cycle variation in the "zero crossings" of the data. In other words, jitter occurs when data samples are taken near, but not exactly at, the desired sample locations of an individual data signal, such that a sample is temporally displaced by an unknown, though usually small interval (e.g., an interval substantially less than or equal to one clock cycle). As such, the overall effect of jitter is to shift a data signal sufficiently in time to cause incorrect sampling of the data signal by the clock signal, and thus, produce a bit error.

Therefore, it would be beneficial to provide a parallel data interface that adjusts a timing relationship of a clock signal to not only minimize clock skew, but to also compensate for noise components, such as data skew and jitter, which may affect one or more paths of a parallel data bus. In this manner, a plurality of data signals having dissimilar transition times can be accurately sampled by adjusting a clock transition to occur at a time that best suits substantially all of the plurality of data signals. As such, the data interface provides error-free data transmission regardless of unpredictable delays along the clock and/or data paths. In general, such a data interface may be included within transmitting and/or receiving portions of any synchronous system.

Figure 5A:
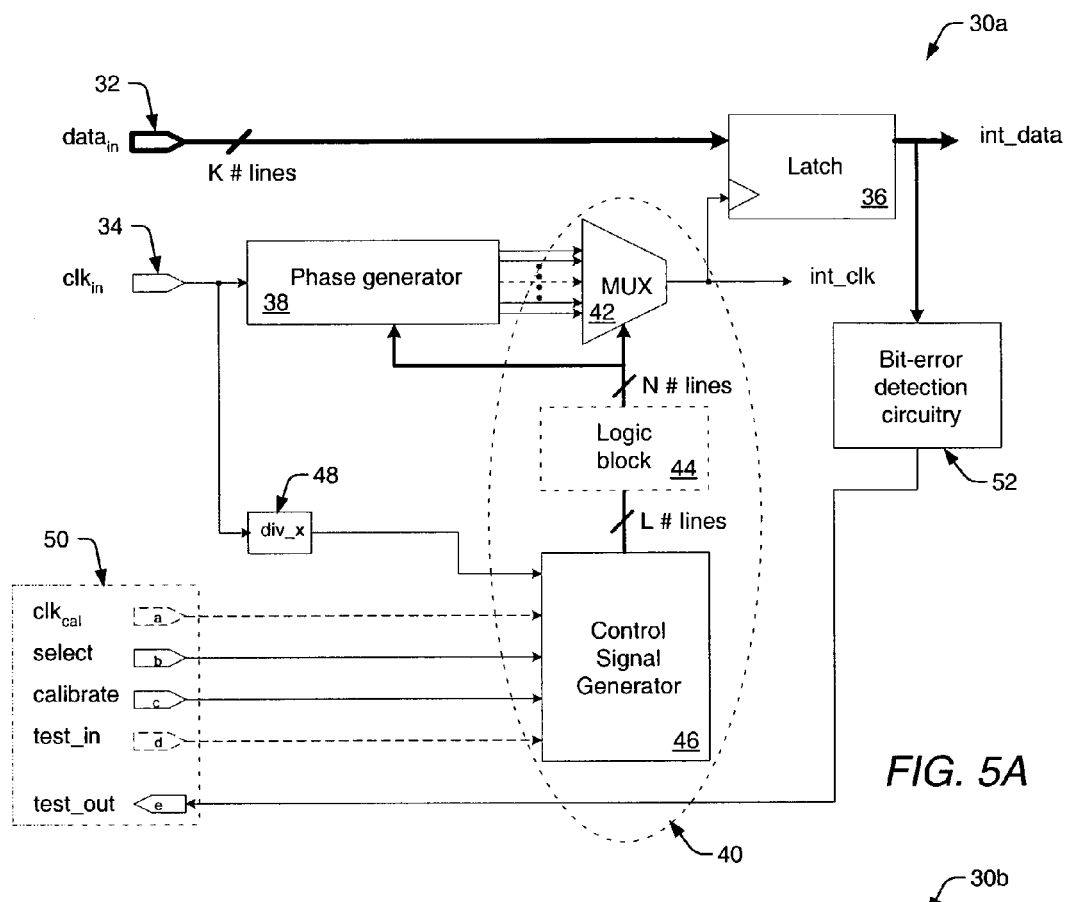
FIG. 5A is a block diagram illustrating a first portion of an exemplary data interface including a serial test access port.
Figure 5B:
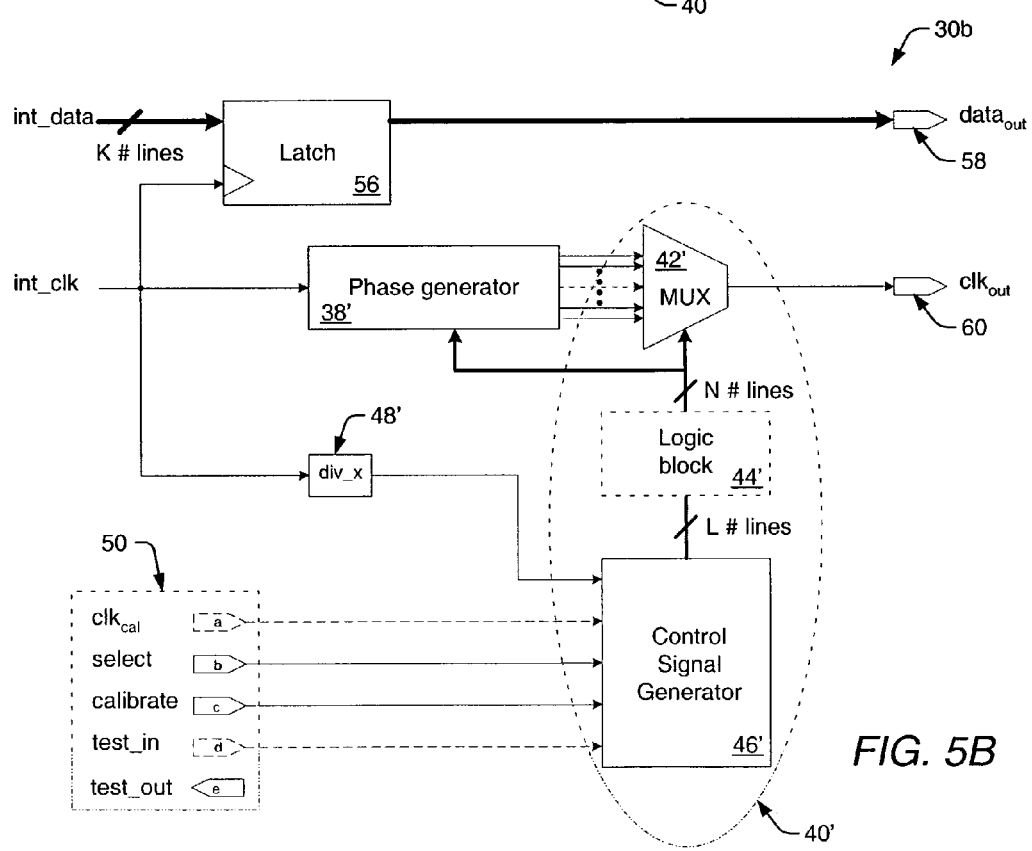
FIG. 5B is a block diagram illustrating a second portion of the exemplary data interface including the serial test access port.

FIGS. 5A and 5B illustrate an exemplary parallel data interface 30, which provides error-free data transmission over a parallel bus within a synchronous system. In some cases, different portions of data interface 30 may be included within transmitting and receiving portions of the synchronous system. In the case of unidirectional data transfer between a transmitter and receiver, for example, only first portion 30a (as shown in FIG. 5A) may be included within the transmitter, whereas only second portion 30b (as shown in FIG. 5B) may be included within the receiver. As will be described in more detail below, first portion 30a is adapted to accurately sample each and every one of the parallel bus data signals within appropriate setup and hold times of the transmitter. Likewise, second portion 30b is adapted to provide the data signals to the receiver after an appropriate access time. In other cases, however, in which data transfer is bi-directional between a host and transceiver, first portion 30a and second portion 30b may each be included within the host and transceiver. For the sake of brevity, data interface 30 will be described herein as including first portion 30a and second portion 30b. In one example, data interface 30 may be included within the physical layers of host and transceiver devices of a communications system or network, such as a local area network (LAN), wide area network (WAN), or Ethernet. In any case, data interface 30 may be included within any system in which two or more devices communicate over parallel buses.

As shown in FIG. 5A, first portion 30a includes a plurality of data input pins 32 coupled to receive a plurality of data signals, $data_{in}$, from a parallel bus of a synchronous system. In addition, first portion 30a includes data interface input latch 36, which is coupled to receive the plurality of data signals from input pins 32 via a plurality of data paths (e.g., K# of lines). First portion 30a also receives a reference clock signal, $clk_{in}$, having a reference frequency and phase at clock input pin 34. In some cases, the reference clock signal may be used to clock the plurality of data signals input to latch 36. However, random noise introduced within one or more data paths may cause one or more data signals to have dissimilar transitions between transitions of the reference clock signal. In some cases, one or more data transitions may be temporally displaced by an amount sufficient to cause a bit error to occur when the plurality of data signals are sampled. A bit error, as described herein, is a sampling error that occurs when a clock transition causes a data signal to be incorrectly sampled. In other words, a logic value of a data signal output from a latch does not equal a logic value of the data signal input to the latch. Thus, it may be beneficial to impart a relative amount of phase delay (i.e., time shift) to the reference clock signal to ensure substantially all of the data signals are accurately sampled.

As such, first portion 30a includes phase generator 38 and phase selector 40, which temporally shift the phase of the reference clock signal by a highly variable, though controllable, amount of phase delay. In general, phase generator 38 may include a delay-locked loop (DLL) device, or alternatively, may include a phase-locked loop (PLL) device, each of which will be described in more detail below. In particular, phase generator 38 is adapted to substantially eliminate propagation delay within the clock distribution network, e.g., delay within the clock path between the output pin of a host device and the input latches of data interface 30 within a transceiver device. Thus, phase generator 38 advantageously eliminates clock skew within the clock path.

In addition, phase generator 38 is further adapted to generate one or more phases with respect to the phase of the reference clock signal. For example, phase generator 38 may receive a reference clock signal having a reference phase, $\phi_{ref}$, and in response, may generate L number of phases, each of which is separated by an incremental amount of phase delay, $\phi_{ref}/L$. Depending on a timing relationship of the plurality of data signals input to latch 36, a select one of the L number of phases may be chosen by phase selector 40 to temporally shift the reference phase of the reference clock signal. Preferably, the select one may impart an extra amount of phase delay (in either a positive or negative direction) to the clock input of latch 36, such that each and every one of the data signals is accurately sampled.

As such, phase selector 40 may include a means to apply only the select one of the plurality of phases to latch 36. In some cases, such means includes multiplexer (MUX) 42, which may receive the plurality of phases from phase generator 38 and, based upon one or more control signals, output the select one of the plurality of phases to the clock input of latch 36. In addition, such means includes control signal generator 46, which may generate the one or more control signals received by MUX 42. In one embodiment, control signal generator 46 is adapted to generate the one or more control signals based upon calibration signals received from two or more input pins of serial test access port 50, as shown in FIGS. 5A and 5B.

In some cases, serial test access port 50 may be a test access port in compliance with IEEE std. 1149.1. Issued as IEEE Std. 1149.1 and 1149.1a, the Joint Test Action Group (JTAG) standard was developed to allow testing of an integrated circuit after it had been assembled onto a printed circuit board. The JTAG standard provides in-system testing for the entire, assembled printed circuit board using a small number of pins associated with a test access port (TAP). The term "JTAG compliant" may be used herein to refer to any device functionally consistent with the IEEE Std. 1149.1 specification.

In general, a JTAG-compliant integrated circuit includes at least four dedicated I/O pins, which constitute the JTAG test access port ("TAP"). Through the TAP, the JTAG-compliant integrated circuit is generally tested using four signals: a serial input signal (TDI), a serial output signal (TDO), a clock signal (TCK), and a mode select signal (TMS). In some instances, additional I/O pins may be added to accommodate other control signals, such as a test reset (TRST) signal. In this manner, the calibration signals of FIGS. 5A and 5B may be coupled to JTAG test access port 50. In one example, a test_in signal may be coupled to TDI pin 50d and a test_out signal may be output from TDO pin 50e. In addition, a $clk_{cal}$ signal may be coupled to TCK pin 50a, a select signal may be coupled to TMS pin 50b, and a calibrate signal may be coupled to TRST pin 50c, in some cases. In other cases, however, serial test access port 50 may not include a JTAG test access port, but instead may include any other serial test access port. The term serial test access port, as described herein, includes any port in which a data pattern is serially shifted into a device under test using only one input pin. In addition, a serial test access port may include an output pin to serially shift the data pattern out of the device under test, and a clock pin to control data transfer between input and output pins, in some cases.

Figure 6:
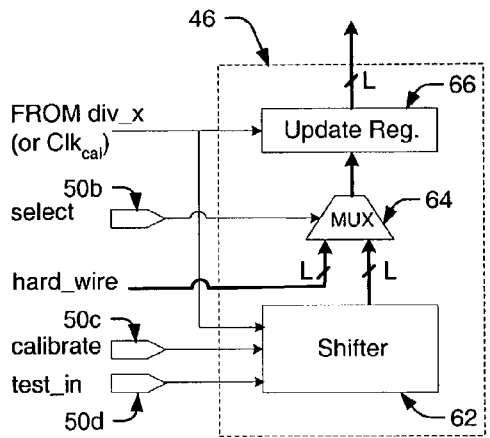
FIG. 6 is a block diagram illustrating one embodiment of a control signal generator as depicted in FIGS. 5A and 5B.

In some embodiments, control signal generator 46 may be formed in such a manner that only three of the four input pins of serial test access port 50 are used to generate the one or more control signals. FIG. 6, for example, illustrates an exemplary block diagram of control signal generator 46 according to such an embodiment. FIG. 6 illustrates control signal generator 46 as including shift register 62, multiplexer (MUX) 64, and update register 66. Shift register 62 may include L number of flip-flops (thereby comprising L number of bit positions), in one example. In some cases, each of the L number of bit positions corresponds to a different control signal output from control signal generator 46. As such, each of the L number of control signals may select one of the plurality of phases generated by phase generator 38.

In addition, shift register 62 may operate in response to a clock signal. In some cases, the clock signal may be derived from the reference clock signal, $clk_{in}$. In such a case, it may be beneficial to divide the reference phase, $\phi_{ref}$, by a factor of x (reference numeral 48 of FIGS. 5A and 5B) to either increase or decrease the clock transition frequency input to shift register 62 and update register 66 of control signal generator 46. In one example, low-cost test devices (not shown) may be used to control the data flow to and from serial test access port 50. Unfortunately, such test devices often operate at relatively low speeds. In another example, a glitch may occur on the internal clock path of the data interface if a new control signal transition clocks MUX 42 at substantially the same time as an adjusted clock transition (output from MUX 42) clocks data interface input latch 36. Such a glitch may result in a metastable state, in which the output of data interface input latch 36 fluctuates for a period of time before settling into a stable output state. In this manner, it may be beneficial to modulate the frequency of the control signal transition to avoid metastability and the assertion of a false bit error signal. In other cases, however, the reference clock signal having a reference phase, $\phi_{ref}$, may be used to clock shift register 62. Alternatively, an additional input pin (e.g., input pin 50a) of serial test access port 50 may be used to supply shift register 62 and update register 66 with a clock signal having substantially any frequency and phase.

Furthermore, shift register 62 may be coupled to receive a calibration signal, such as the calibrate signal from serial port input pin 50c. In some cases, the calibrate signal may be a one-bit control signal that either enables or disables a calibration process of the control signal generator. For example, a calibration process may be enabled with a logic level high calibrate signal applied to serial port input pin 50c. Alternatively, the calibration process may be enabled with a logic level low calibrate signal applied to serial port input pin 50c. Once the calibration process is enabled, a test_in signal may be serially shifted into shift register 62 from serial port input pin 50d. In some cases, the test_in signal may be a calibration signal having L number of bit positions.

As an example, suppose that shift register 62 includes nine bit positions, each of which is represented by one flip-flop of the shift register. As stated above, each of the nine bit positions corresponds to a different control signal that may be used to select a different phase from phase generator 38. Upon activation of the calibration process, shift register 62 may be programmed with a first calibration signal (i.e., a first test_in signal) received from input pin 50d. In some cases, shift register 62 may be programmed to store a logic level high value (i.e., a '1') within one flip-flop of the shift register, while logic level low values (i.e., a '0') are stored within the remaining eight flip-flops of the shift register. As such, shift register 62 may output a first control signal to MUX 64 having a value of "000001000," in one example. At the next clock cycle, shift register 62 may be programmed with a second calibration signal (i.e., a second test_in signal) received from input pin 50d. In most cases, the second calibration signal may be different from the first calibration signal. As such, the position of the logic level high bit in the second calibration signal may be chosen at random, in one example. In another example, however, an algorithm, a mathematical equation, a statistical result, or any other programmable means may be used to choose the position of the logic level high bit in the second calibration signal. Thus, shift register 62 may output a second control signal to MUX 64 having a value of "010000000," in one example. In this manner, shift register 62 may generate subsequent control signals based upon the test_in calibration signals received from serial port input pin 50d.

Therefore, during the calibration process, shift register 62 is adapted to produce L number of distinct control signals to programmably select a different one of the L number of phases generated by phase generator 38. During the calibration process, MUX 64 is coupled to receive each of the L number of control signals (each comprising L number of bits) from shift register 62 and to transmit each of the control signals to update register 66. Update register 66 is also coupled to receive the clock signal (e.g., $clk_{cal}$, $clk_{in}$ or a derivative of $clk_{in}$), such that when one control signal is clocked out of control signal generator 46 from update register 66, a subsequent control signal is generated by shift register 62.

Figure 7:
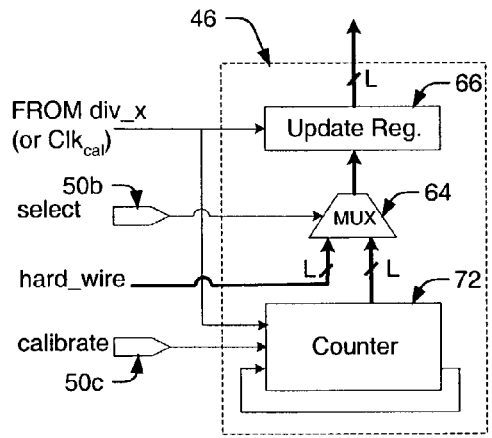
FIG. 7 is a block diagram illustrating another embodiment of a control signal generator as depicted in FIGS. 5A and 5B.

In other embodiments, control signal generator 46 may be formed in such a manner that only two of the four input pins of serial test access port 50 are used to generate the one or more control signals. FIG. 7, for example, illustrates an exemplary block diagram of control signal generator 46 according to the current embodiment, in which the number of input pins of serial test access port 50 is advantageously reduced over the embodiment described above in reference to FIG. 6. As such, FIGS. 6 and 7 differ by way of replacing shift register 62 (of FIG. 6) with circular counter 72 (of FIG. 7) in control signal generator 46. However, where FIGS. 6 and 7 include similar circuit elements, e.g., multiplexer (MUX) 64 and update register 66, those circuit elements are described below using identical reference numerals.

In some cases, circular counter 72 may be implemented as a circular shift register having L number of flip-flops (thereby comprising L number of bit positions), for example. As such, one difference between shift register 62 and circular counter 72 is the addition of a feedback loop within circular counter 72. In general, the feedback loop is added to connect an output of the last flip-flop to an input of the first flip-flop within circular counter 72. In this manner, circular counter 72 is adapted to generate L number of control signals independent of an external source, such as the test_in signals received from serial port input pin 50d by shift register 62. As stated above, each of the L number control signals may select one of the L number of phases generated by phase generator 38, in some cases.

In addition, circular counter 72 may operate in response to a clocking signal. Similar to the clock signal described above in reference to FIG. 6, the clock signal of the current embodiment may be supplied from the reference clock signal ($clk_{in}$) having a reference phase, $\phi_{ref}$, or a derivative of the reference clock signal having a phase, $\phi_{ref}/x$. Alternatively, the clock signal of the current embodiment may be calibration clock signal, $clk_{cal}$, having substantially any frequency and phase. Such a calibration clock signal may be input to serial port input pin 50a, for example.

Furthermore, circular counter 72 may be coupled to receive a calibration signal, such as the calibrate signal from serial port input pin 50c. As stated above, the calibrate signal may be a one-bit control signal that either enables or disables a calibration process of the control signal generator. If the calibration process is enabled, e.g., with a logic level high calibrate signal, circular counter 72 will begin counting from an initialization value. As an example, suppose that circular counter 72 includes nine bit positions, each of which is represented by one flip-flop of the circular shift register. As stated above, each of the nine bit positions corresponds to a different control signal that may select a different phase generated by the phase generator. Upon activation of the calibration process, circular counter 72 may be initialized to a value of "100000000" to obtain a first control signal, in some cases. At the next clock cycle, circular counter 72 may shift the logic level high bit to the next bit position, resulting in a value of "010000000" to obtain a second control signal, in some cases. In this manner, the logic level high bit is sequentially shifted through each one of the bit positions of circular counter 72 to obtain a different control signal at every clock transition. Once the logic level high bit reaches the final bit position, "000000001," the bit may then be fed back to the first bit position. In other cases, however, the logic level high bit may be sequentially shifted in a right-to-left direction instead of a left-to-right direction.

Therefore, during the calibration process, circular counter 72 is adapted to produce L number of distinct control signals to sequentially select each one of the L number of phases generated by phase generator 38. During the calibration process, MUX 64 is coupled to receive each of the L number of control signals (each comprising L number of bits) from circular counter 72 and to transmit each of the control signals to update register 66. Update register 66 is also coupled to receive the clocking signal (e.g., $clk_{cal}$, $clk_{in}$, or a derivative of $clk_{in}$), such that when one control signal is clocked out of control signal generator 46 from update register 66, a subsequent control signal is generated by circular counter 72.

After an initial calibration process, however, it may be desired to "hardwire" a specific control signal representing a "best phase" to sample the plurality of data signals at the input of latch 36. Thus, FIGS. 6 and 7 depict MUX 64 additionally coupled to receive another L number of bits, which represent a "best phase" control signal, from a hard_wire input. The hard_wire input may be chosen by a calibration signal coupled to MUX 64, such as the select signal from serial port input pin 50b. In some cases, when the calibration process is disabled (e.g., by a logic level low calibrate signal) the select signal may choose the hard_wire input of MUX 64 with a logic level high value, for example. Otherwise, the select signal may choose the calibration input (from shift register 62 or circular counter 72) of MUX 64 with a logic level low value, for example. Alternatively, the select signal may choose the hard_wire input with a logic level low value and the calibration input with a logic level high value.

In some cases, the hard_wire input may be coupled to L number of circuit elements, e.g., L number of switches or transistors, each of which are coupled to either a power supply (to represent a logic level high bit) or a ground connection (to represent a logic level low bit). The sequence by which each of the circuit elements are coupled to one of the connections will determine the best phase control signal. In some cases, it may be desirable to change the sequence by which the circuit elements are hardwired to program a different best phase control signal. As such, the L number of circuit elements are preferably re-programmable circuit elements.

In other cases, however, the hard_wire input of MUX 64 may alternatively be coupled to a re-programmable storage element, e.g., a register having L number of cells, which is controlled by a special state of a state machine. As such, the state machine may determine the best phase control signal by programming each of the L number of cells within the register to store a certain logic value. In the case that data interface 30 includes a JTAG test access port 50, for example, the state machine may be implemented as a JTAG state machine.

It may be advantageous to "hardwire" control signal generator 46 to output only the "best phase" control signal to phase generator 38 after an initial calibration process. In some cases, selecting a predetermined best phase with a hardwired control signal may advantageously reduce the overall power consumed by data interface 30. For example, one or more circuit elements of the data interface may be powered down when a calibration process is not in progress. In particular, circuit elements only required during the calibration process (e.g., shifter 62, circular counter 72, and logic block 92) may be powered down to reduce the overall power consumed by data interface 30. In addition, the ability to reprogram a hardwired control signal advantageously provides the user with flexibility in tailoring the data interface to fit one or more specific applications.

Returning to FIG. 5A, phase generator 38 may derive L number of phases from a reference clock signal having a reference phase, $\phi_{ref}$, in one embodiment. In such an embodiment, each of the L number of phases is separated by an incremental amount of phase delay, $\phi_{ref}/L$. In an alternative embodiment, however, it may be desirable to generate substantially more than L number of phases from the reference clock signal. For example, phase generator 38 may be adapted to generate N number of phases, such that N is substantially greater than L, in some cases. In other cases, phase generator 38 may be adapted to generate N number of phases, such that N is substantially equal to $2^L$ (i.e., two raised to the power of L). In such an alternative embodiment, logic block 44 may be coupled to receive the L number of control signals from control signal generator 46 and, in response, provide N number of control signals to phase generator 38. In this manner, each of the N number of control signals may be used to select a different one of the N number of phases generated by phase generator 38. Thus, logic block 44 may be implemented as an L:N encoder, for example.

By increasing the number of phases generated by phase generator 38, the incremental amount that separates each of the N number of phases (i.e., the phase increment) may be advantageously decreased to $\phi_{ref}/N$. As such, phase generator 38 is adapted to provide a relatively finer phase adjustment to the clock input of latch 36, in some embodiments. In some cases, the phase increment, $\phi_{ref}/N$, may be decreased to approximately 50 ps or below. In any case, a minimum phase increment is generally dependent upon the technology used to fabricate the basic circuit elements of data interface 30. For example, a phase increment of approximately 30 ps may be obtained using current CMOS 0.13 μm technology, whereas a phase increment of approximately 20 ps may be obtained using current CMOS 0.09 μm technology.

As stated above, phase generator 38 may be fabricated to include a delay-locked loop (DLL, not shown) device, in some cases. Generally, a DLL is a closed-loop device that, in it's simplest form, consists of a variable delay line and control logic. Variable delay lines can be built using a voltage-controlled delay, or alternatively, using a series of discrete delay elements. In this manner, a DLL works by inserting an amount of delay between the reference clock signal and a feedback clock signal until transitions of the two signals align, usually 360° out of phase with one another. Once a transition of the feedback signal aligns with a transition of the reference clock signal, the DLL "locks" the phase of the DLL output clock.

Figure 8:
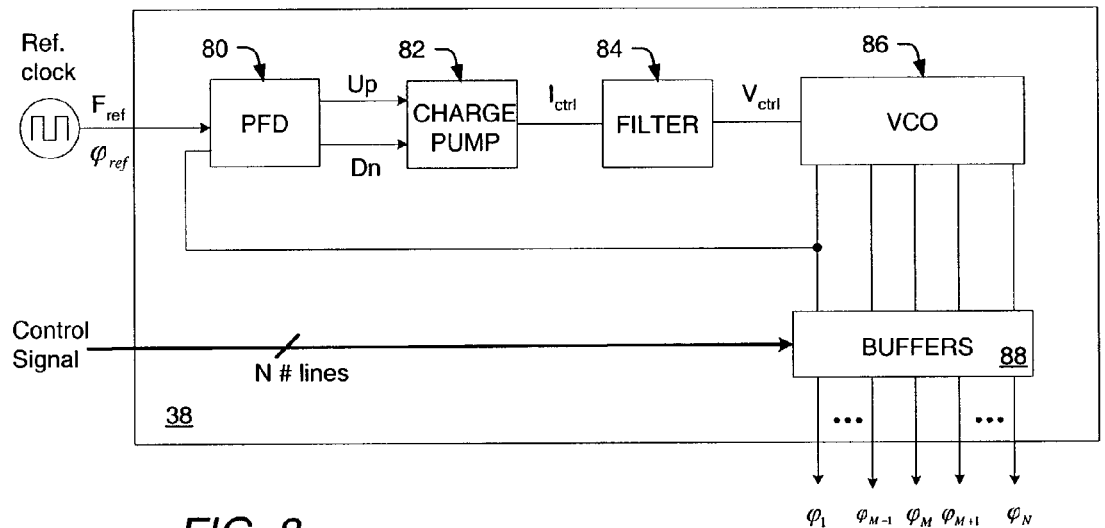
FIG. 8 is a block diagram illustrating one embodiment of a phase generator as a phase-locked loop (PLL) device.

In other cases, however, phase generator 38 may include a phase-locked loop (PLL) device, as shown in FIG. 8. A fundamental difference between a PLL and a DLL device is that instead of a delay line, a PLL uses a voltage-controlled oscillator (VCO) to generate one or more phases of the reference clock signal. In general, a PLL may include four main components, such as phase frequency detector (PFD) 80, charge pump 82, filter 84, and VCO 86, in some cases. In particular, PFD 80 is coupled to receive and compare a reference clock signal to a feedback signal generated by the remaining components of the PLL circuit. In response to frequency and/or phase differences between the signals, PLL control logic (e.g., PFD 80, charge pump 82, and filter 84) is adapted to adjust the frequency and phase of the oscillator clock (i.e., feedback clock output from VCO 86) until the rising edge of the feedback clock aligns with the rising edge of the reference clock. At such a time, the PLL "locks" the phase of the PLL output clock.

The closed-loop device ultimately chosen to represent phase generator 38 may depend on the specifications of the synchronous system. For example, PLL devices are often used as frequency multipliers, and thus, can be used to generate phases at relatively low to relatively high operating speeds (e.g., operating frequencies ranging from a few hundred Hertz (Hz) to approximately 40 GHz or above). On the other hand, DLL devices operate at substantially lower operating speeds (e.g., operating frequencies ranging from a few hundred Hertz to a few Gigahertz), and thus, consume substantially less power than high-speed PLL devices. In addition, DLL devices are typically first order systems, which are substantially easier to implement than PLL devices. Furthermore, DLL devices do no suffer from jitter accumulation often introduced by the VCO of a PLL device. Therefore, phase generator 38 may be implemented as a DLL device in the case that low power, low jitter, and ease of implementation is a design consideration. Otherwise, phase generator 38 may be implemented as a PLL device in the case that maximum operating speed is design consideration. Note, however, that the phase generators described herein are implemented as PLL devices for the sake of brevity.

In any case, phase generator 38 is adapted to generate a plurality of phases, as described above. In some cases, phase generator 38 may be adapted to generate N number of phases. In particular, FIG. 8 illustrates phase generator 38 (e.g., a PLL device) as providing N number of phases, which are denoted as $\phi_1$ to $\phi_N$. As shown in FIG. 8, the N number of phases are arranged around a middle phase, $\phi_M$. In some cases, the middle phase, $\phi_M$, may be substantially equal to the reference clock phase, $\phi_{ref}$. In this manner, approximately half of the N number of phases are substantially greater than and approximately half of the N number of phases are substantially less than the reference clock phase. For example, each of the N number of phases is separated by an incremental phase amount, $\phi_{ref}/N$, such that a positive incremental phase, $\phi_{M+1}$, may provide a timing correction substantially equal to $\phi_{ref}+\phi_{ref}/N$. In such an example, a negative incremental phase, $\phi_{M-1}$, may provide a timing correction substantially equal to $\phi_{ref}-\phi_{ref}/N$. Thus, the clock transition may be adjusted by relatively small, incremental amounts of phase delay in either a positive or negative direction. In other cases, however, the reference clock phase, $\phi_{ref}$, may be substantially equal to a first output phase, $\phi_1$, a last output phase, $\phi_N$, or any other phase in between $\phi_1$ and $\phi_N$.

As stated above, phase selector 40 may be adapted (e.g., by including MUX 42) to apply only the select one of the plurality of phases to latch 36, in one embodiment. In an alternative embodiment, however, phase generator 38 may be adapted to apply only the select one of the plurality of phases to latch 36. In one example, phase generator 38 may include a plurality of buffers 88, where each of the plurality of buffers is coupled to receive one of the N number of phases output from VCO 86. In addition, each of the buffers 88 may be coupled to receive one of the N number of control signals output from control signal generator 46 and logic block 44, in some cases. In this manner, substantially all of the plurality of buffers 88, with the exception of a select one, may be "powered-down" by a logic value (e.g., a 'O' or logic low value) of the N number of control signals, thereby preventing phase generator 38 from outputting more than the select one of the plurality of phases. In other words, only the select one of the plurality of phases is provided to MUX 42, in some cases. Thus, phase generator 38 is advantageously adapted to reduce the power and noise coupling produced by numerous phases entering MUX 42 at substantially the same time.

Phase generator 38 and phase selector 40 are also adapted to output a select one of a plurality of phases to the internal clock path (i.e., int_clk) of data interface 30 prior to the clock input of latch 36. Thus, phase generator 38 and phase selector 40 are adapted to adjust a timing relationship of the clock transition before the plurality of data signals are sampled by latch 36. In this manner, even though the plurality of data signals may have dissimilar transitions, phase generator 38 and phase selector 40 are adapted to temporally shift the clock transition to a time between appropriate setup and hold time specifications for each and every one of the plurality of data signals. More specifically, the clock transition can be adjusted to occur at a time that allows each and every one of the plurality of data signals to become stable for a setup time before the clock transition, and remain stable for a hold time after the clock transition, thereby substantially eliminating the occurrence of bit errors along the plurality of data paths. Therefore, FIG. 5A illustrates first portion 30a of data interface 30 as being adapted to accurately sample each and every one of the plurality of data signals within appropriate setup and hold time specifications of the transmitting portion of the synchronous system.

As shown in FIG. 5B, second portion 30b includes data interface output latch 56, which is coupled to receive the plurality of data signals, "int_data," sampled by data interface input latch 36. In addition, output latch 56 is coupled to receive a clock transition, which may be previously adjusted by phase generator 38 and phase selector 40, from internal clock path, "int_clk." As such, first portion 30a may be directly coupled to second portion 30b, in some cases. In other cases, however, one or more circuit elements may be coupled to the clock path and/or to the plurality of data paths between first portion 30a and second portion 30b.

In some cases, second portion 30b includes phase generating and selecting circuit elements substantially identical to those described above in reference to first portion 30a, as shown in FIG. 5A. In general, duplicate circuit elements are identified with primed reference numerals in FIG. 5B. For example, where first portion 30a includes phase generator 38 and phase selector 40, second portion 30b includes second phase generator 38' and second phase selector 40'. In particular, detailed descriptions of the circuit elements duplicated in FIG. 5B may be found, for example, by referring back to the detailed description of FIGS. 5A and 6–8.

Though first portion 30a and second portion 30b include substantially identical circuit elements, the function of each portion may differ due to differences in coupling of the circuit elements to input and output latches of data interface 30. For example, as stated above, phase generator 38 and phase selector 40 are coupled to adjust a timing relationship of a clock transition before the clock input of data interface input latch 36 (see FIG. 5A). As such, first portion 30a is adapted to accurately sample each and every one of the plurality of data signals within appropriate setup and hold time specifications of the transmitting portion of the synchronous system.

On the other hand, second phase generator 38' and second phase selector 40' are coupled to adjust a timing relationship of a clock transition after the clock input of data interface output latch 56 (see FIG. 5B). In this manner, second phase generator 38' and second phase selector 40' are adapted to supply an adjusted clock transition to clock output pin 60 before the sampled data signals are supplied to respective data output pins 58. To do so, second phase generator 38' and second phase selector 40' are adapted to temporally shift the clock transition to arrive before the sampled data transitions by an amount of time, which allows subsequent circuit elements to receive the sampled data transitions within an access time specification. In some cases, such an access time specification may be imparted by second portion 30b to account for the amount of setup time imparted by first portion 30a. By accounting for such an access time specification, second phase generator 38' and second phase selector 40' are adapted to substantially eliminate the occurrence of bit errors at the output pins of the data interface. Thus, FIG. 5B illustrates second portion 30b of data interface 30 as being adapted to provide the sampled data signals to the receiving portion of the synchronous system after an appropriate amount of access time.

So far, the above description of FIGS. 5–8 illustrates one embodiment of a parallel data interface that, based upon calibration signals input to serial test access port 50, imparts a highly variable, though controllable amount of phase delay to a clock path of the data interface to compensate for noise induced within one or more paths of a parallel data bus. Thus, parallel data interface 30 is adapted to advantageously eliminate data skew and/or jitter within the parallel data bus, in addition to eliminating clock skew within the clock path. As such, parallel data interface 30 is adapted to provide error-free data transmission over a parallel data bus.

Figure 10A:
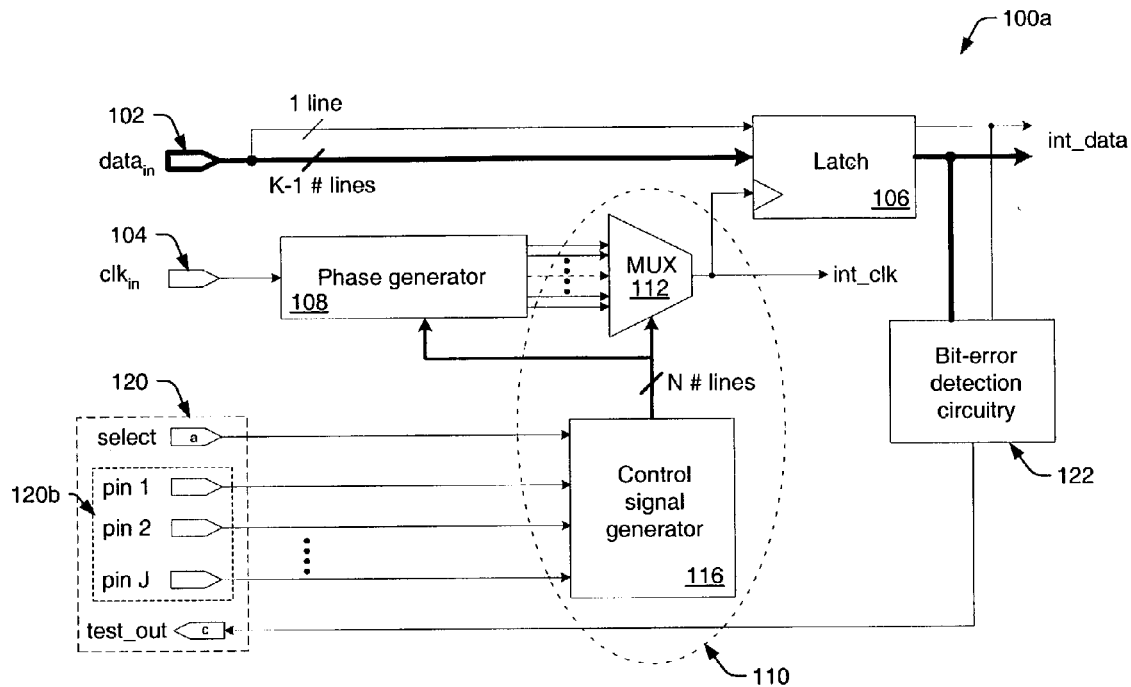
FIG. 10A is a block diagram illustrating a first portion of another exemplary data interface including a parallel test access port.
Figure 10B:
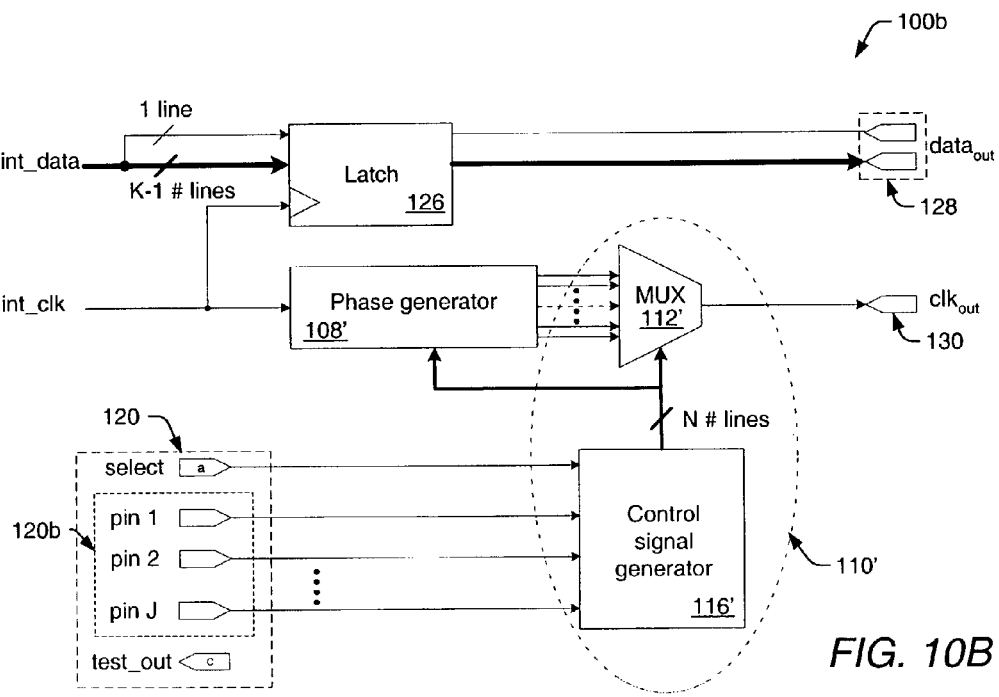
FIG. 10B is a block diagram illustrating a second portion of another exemplary data interface including a parallel test access port.

FIG. 10, however, illustrates an alternative embodiment of a parallel data interface. In general, FIG. 10 illustrates data interface 100, which includes parallel test access port 120 instead of the serial test access port 50 included within data interface 30, as shown in FIG. 5. FIGS. 10A and 10B illustrate data interface 100 as including first portion 100a and second portion 100b. Similar to first portion 30a (as shown in FIG. 5A), first portion 100a (as shown in FIG. 10A) includes a plurality of data input pins 102, a clock input pin 104, and data interface input latch 106. In some cases, a reference clock signal, $clk_{in}$, from clock input pin 104 may be used to clock a plurality of data signals, $data_{in}$, which are input to latch 106. As stated above, however, random noise introduced within one or more of paths of the parallel data bus may cause one or more data signals to have dissimilar transitions between transitions of the reference clock signal. In some cases, one or more data transitions may be temporally displaced by an amount sufficient to cause a bit error to occur upon sampling of the data signals.

Therefore, first portion 100a includes phase generator 108 and phase selector 110 to impart a relative amount of phase delay (i.e., time shift) to the reference clock signal to enable each and every one of the plurality of data signals to be accurately sampled by input latch 106. In some cases, phase generator 108 may be a delay-locked loop (DLL, not shown) device. In other cases, however, phase generator 108 may be a phase-locked loop (PLL) device, as shown in FIG. 8. In particular, a detailed description of the circuit elements and function of phase generator 108 may be found, for example, by referring back to the detailed description of phase generator 38 in FIGS. 5A and 8. In any case, phase generator 108 is adapted to impart a highly variable, though controllable amount of phase delay to the reference clock signal. In this manner, phase generator 108 advantageously eliminates clock skew within the clock path of the synchronous system. In addition, phase generator 108 is adapted to produce a plurality of phases (i.e., time delay signals) based upon the phase of the reference clock signal.

In some cases, phase selector 110 includes a means to apply only a select one of the plurality of phases to input latch 106. For example, such means may include multiplexer (MUX) 112 (as shown in FIG. 10A), which receives the plurality of phases from phase generator 108 and, based upon one or more control signals from control signal generator 116, outputs the select one of the plurality of phases to input latch 106. In other cases, however, phase generator 108 may alternatively include the means to apply only the select one of the plurality of phases to input latch 106. For example, such means may include a plurality of buffers (e.g., buffers 88, as shown in FIG. 8), which are adapted to output only the select one, and thus, "power down" the unselected ones of the plurality of phases. In particular, phase generator 108 is adapted to select the one of the plurality of phases based upon control signals received from control signal generator 116. Therefore, in some cases, phase generator 108 is adapted to reduce the power and noise coupling produced by numerous phases entering MUX 112 at substantially the same time.

In any case, the means to apply only the select one of the plurality of phases to input latch 106 also includes control signal generator 116, which may generate the one or more control signals received by MUX 112 and/or phase generator 108. In one embodiment, control signal generator 116 is adapted to generate the one or more control signals based upon calibration signals received from a plurality of input pins of parallel test access port 120, as shown in FIGS. 10A and 10B. In some cases, parallel test access port 120 may be implemented as any parallel fed test access port. The term parallel test access port, as described herein, includes any port in which a parallel data pattern is input to a device under test using two or more input pins. In addition, a parallel test access port may include two or more output pins to output the parallel data pattern from the device under test, and a clock pin to control data transfer between input and output pins, in some cases.

Figure 9:
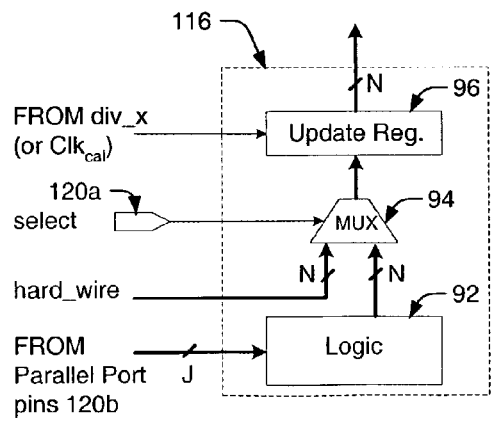
FIG. 9 is a block diagram illustrating one embodiment of a control signal generator as depicted in FIGS. 10A and 10B.

In some embodiments, control signal generator 116 may be coupled to receive calibration signals from J+1 number of parallel port input pins 120 (as shown in FIGS. 10A and 10B). FIG. 9, for example, illustrates an exemplary block diagram of control signal generator 116 according to such an embodiment. FIG. 9 illustrates control signal generator 116 as including logic block 92, MUX 94, and update register 96. In general, logic block 92 is coupled to receive J number of calibration signals from J number of input pins (reference numeral 120b) of parallel port 120 and, in response, produce one or more control signals during a calibration process.

In some cases, phase generator 108 is adapted to produce J number of phases. In such a case, logic block 92 is adapted to produce J number of control signals, each of which is used to select a different one of the J number of phases from phase generator 108. In this manner, one of the J number of phases may be selected by applying a logic value (e.g., a logic high value) to only one of the parallel port input pins 120b, while applying an opposite logic value (e.g., a logic low value) to the remaining J-1 number of parallel port input pins 120b. As such, a different one of the J number of phases may be selected by applying the logic high value to a different one of the parallel port input pins 120b.

In other cases, however, phase generator 108 is adapted to provide N number of phases, as described above in reference to phase generator 38 (shown in FIGS. 5 and 8). In such a case, logic block 92 is adapted to encode the J number of calibration signals into N number of control signals, where the value of N is substantially greater than the value of J. For example, one of the J number of phases may be selected by applying a logic value (e.g., a logic high value) to a group of one or more parallel port input pins 120b, while applying an opposite logic value (e.g., a logic low value) to the remainder of the parallel port input pins 120b. As such, a different one of the N number of phases may be selected by applying a logic high value to a different group of one or more parallel port input pins 120b. Thus, logic block 92 may be implemented as a J:N encoder, in some cases, which advantageously decreases the number of parallel port input pins 120b relative to the number of phases generated by phase generator 108.

Therefore, logic block 92 is adapted to programmably select a different one of the plurality of phases generated by phase generator 108 during the calibration process. In addition, MUX 94 is coupled to receive each of the control signals from logic block 92 and to transmit each of the control signals to update register 96. Update register 66 is also coupled to receive a clocking signal (e.g., $clk_{cal}$, $clk_{in}$, or a derivative of $clk_{in}$), such that when one control signal is clocked out of control signal generator 116 from update register 96, a subsequent control signal is generated by encoding the calibration signals from parallel port input pins 120b at logic block 92.

After an initial calibration process, however, it may be desired to "hardwire" a specific control signal representing a "best phase" to be used to sample the plurality of data signals at the input of latch 106. Thus, FIG. 9 depicts MUX 94 additionally coupled to receive a "best phase" control signal from a hard_wire input. The hard_wire input may be chosen by a calibration signal coupled to MUX 94, such as the select signal from parallel port input pin 120a. In some cases, the select signal may choose the hard_wire input of MUX 94, e.g., with a logic level high value, to disable the calibration process. In other cases, the select signal may enable the calibration process by choosing the calibration input (from logic block 92) of MUX 94 with a logic level low value, for example. Alternatively, the select signal may choose the hard_wire input with a logic level low value and the calibration input with a logic level high value. In any case, circuit elements coupled to the hard_wire input of MUX 94 may be implemented as described above in reference to FIGS. 6 and 7.

Therefore, FIG. 10A illustrates first portion 100a of data interface 100 as being adapted to accurately sample each and every one of the plurality of data signals within appropriate setup and hold time specifications of the transmitting portion of the synchronous system. Likewise, FIG. 10B illustrates second portion 100b of data interface 100 as being adapted to provide the sampled data signals to the receiving portion of the synchronous system after an appropriate amount of access time.

In general, second portion 100b includes data interface output latch 126, which is coupled to receive the plurality of data signals, "int_data," sampled by data interface input latch 106. In addition, output latch 56 is coupled to receive a clock transition, which may have been previously adjusted by phase generator 108 and phase selector 110, from internal clock path, "int_clk," in some cases. As such, first portion 100a may be directly coupled to second portion 10b, in some cases. In other cases, however, one or more circuit elements may be coupled to the clock path and/or to the plurality of data paths between first portion 100a and second portion 10b.

In some cases, second portion 100b includes phase generating and selecting circuit elements substantially identical to those described above in reference to first portion 100a and illustrated in FIG. 10A. In general, duplicate circuit elements are identified with primed reference numerals in FIG. 10B. In addition, detailed descriptions of the duplicate circuit elements in FIG. 10B may be found, for example, by referring back to the detailed description of FIGS. 9 and 10A. In particular, second portion 100b includes second phase generator 108' and a second phase selector 110', which are coupled to adjust a timing relationship of a clock transition after the clock input of data interface output latch 126 (see FIG. 10B). As such, a plurality of data signals, $data_{out}$, output from latch 126 are received at data output pins 128 an amount of time after the adjusted clock transition, $clk_{out}$, is supplied to clock output pin 130. Such an amount of time is generally referred to as a positive access time, and allows a receiving portion of a synchronous system to account for a setup time imparted by a transmitting portion of the synchronous system.

Therefore, the above description of FIGS. 9 and 10 illustrates an alternative embodiment of a parallel data interface that, based upon calibration signals input to parallel test access port 120, imparts a highly variable, though controllable amount of phase delay to a clock path of the data interface to compensate for noise induced within one or more paths of a parallel data bus. In this manner, parallel data interface 100 is adapted to advantageously eliminate data skew and/or jitter within the parallel data bus, in addition to eliminating clock skew within the clock path. As such, parallel data interface 100 is adapted to provide error-free data transmission over a parallel data bus.

FIG. 11A illustrates a method for adjusting a timing relationship between a clock signal and a plurality of data signals input to a parallel data interface. In general, the method provides a timing correction to a clock path of the data interface, which not only effectively eliminates clock skew along the clock path, but also compensates for noise induced within one or more paths of a parallel data bus. In some cases, such noise may be due to, e.g., data skew and/or jitter within one or more paths of the parallel data bus. Thus, the method described herein provides error-free data transmission by adjusting a clock transition to accurately sample each and every one of a plurality of data signals having dissimilar transitions between transitions of the clock signal.

As such, FIG. 11A illustrates a plurality of data signals 150 transferred between transmitting (e.g., host device 170) and receiving (e.g., transceiver device 190) portions of a synchronous system over parallel data bus 175. In addition, FIG. 11A depicts clock signal 160 transferred between host device 170 and transceiver device 190 along a separate clock path. In this manner, a first transition 162 of clock signal 160 may output the plurality of data signals 150 to parallel data bus 175 by clocking an output latch 174 of a parallel data interface (not shown) within host device 170.

As will be described in more detail below, plurality of data signals 150 may represent a test pattern during a calibration process of parallel data interface 180. For example, FIG. 11A illustrates the test pattern as including substantially all positive pulses (i.e., all logic level high values) followed by substantially all negative pulses (i.e., all logic level low values). In such an example, the edges or transitions of the test pattern are depicted as rising edges for all of the plurality of data signals 150. Note, however, that the test pattern could include substantially all negative pulses followed by substantially all positive pulses, or alternatively, could include a combination of positive and negative pulses transitioning during a single clock pulse. As such, data transitions may be generically described as "beginnings" and "endings" of individual data signals occurring during a single clock pulse. However, data transitions are described herein as having rising edges and falling edges corresponding to the positive pulse test pattern illustrated in FIG. 11A.

As shown in FIG. 11A, noise may be induced within one or more paths of parallel data bus 175 causing one or more active edges of the plurality of data signals 150 to become misaligned prior to clocking input latch 182 of parallel data interface 180. As such, the induced noise may shift one or more of the plurality of data signals 150 sufficiently in time to cause incorrect sampling of the one or more data signals at input latch 182. In some cases, the one or more data signals may not be stable for at least a specified amount of time before second clock transition 164 samples the one or more data signals at input latch 182. Such an amount of time is generally referred to as a data "setup" time, and is often specified in terms of a minimum setup time for a particular synchronous system. In other cases, the one or more data signals may not be stable for at least a specified amount of time after second clock transition 164 samples the one or more data signals at input latch 182. Such an amount of time is generally referred to as a data "hold" time, and is often specified in terms of a minimum hold time for a particular synchronous system. In this manner, second clock transition 164 may sample the one or more data signals incorrectly if they are sampled before a minimum setup time threshold and/or after minimum hold time threshold (as illustrated in FIG. 11B).

In some cases, minimum setup and hold times may be specified for transmitting and/or receiving portions of the synchronous system. The combination of a minimum setup time and a minimum hold time may range, for example, between about 20% and about 30% of a sampling clock period (e.g., a clock period of clock signal 160). In one example, a minimum setup time may be about 15% and a minimum hold time may be about 5% of a sampling clock period.

Therefore, the method includes adjusting the timing of second clock transition 164 to accurately sample each and every one of the plurality of data signals 150, in some embodiments. In particular, the method includes applying a select one of a first plurality of phases (i.e., time delay pulses) to the clock path of data interface 180 prior to clocking input latch 182. As such, the method includes adjusting the timing of second clock transition 164 to arrive at input latch 182 within a setup/hold time "phase window." In some cases, a setup/hold time "phase window" may be described as a period of time in which substantially all of the plurality of data signals are stable, and thus, may be sampled without the occurrence of a bit error. In other words, second clock transition 164 may be temporally shifted to arrive at input latch 182 at a time after the arrival of a last rising edge 152 and before the arrival of a first falling edge 154 of the plurality of data signals 150. Therefore, the method adjusts the timing of a clock transition to arrive after a minimum setup time threshold and before a minimum hold time threshold for each and every one of the plurality of data signals. For example, FIG. 11B illustrates an exemplary timing adjustment of second clock transition 164 (as shown in FIG. 11A), in which the timing of second clock transition 164 is adjusted to arrive after a minimum setup time threshold 153 and before minimum hold time threshold 155 of the synchronous system.

In some embodiments, the method may also include adjusting the timing of a clock transition to arrive at a clock output pin at least a specified amount of time before the sampled data arrives at data output pins of the data interface. Such an amount of time is generally referred to as a positive "access" time, and is often specified in terms of a minimum access time for a particular synchronous system. As stated above, a minimum access time may allow a receiving portion of a synchronous system to account for a setup time imparted by a transmitting portion of the synchronous system. As such, a minimum access time may range, for example, between about 20% and about 30% of a sampling clock period (e.g., a clock period of clock signal 160). In this manner, a clock transition may sample one or more data signals incorrectly if they are sampled before a minimum access time threshold (as illustrated in FIG. 11C).

Subsequent to clocking output latch 184 with third clock transition 166, the method may include adjusting the timing of fourth clock transition 168 to provide the plurality of data signals 150 to data output pins after at least a minimum access time. In particular, the method includes applying a select one of a second plurality of phases (i.e., time delay pulses) to the clock path of data interface 180 subsequent to clocking output latch 184. In this manner, the method includes adjusting fourth clock transition 168 to arrive at a clock output pin within an access time "phase window." An access time "phase window" may be described herein as a period of time in which a clock transition arrives before each and every one of the plurality of data signals become stable. In other words, fourth clock transition 168 may be temporally shifted to arrive at the clock output pin at least a minimum access time before a last rising edge 156 of the plurality of data signals 150. Therefore, the method adjusts the timing of a clock transition to arrive before a minimum access time threshold for each and every one of the plurality of data signals. For example, FIG. 11C illustrates an exemplary timing adjustment of fourth clock transition 168 (as shown in FIG. 11A), in which the timing of fourth clock transition 168 is adjusted to arrive before minimum access time threshold 157.

In addition, the method includes applying a signal to an input pin of the data interface, which is adapted to select between predetermined control values and control values output from a control signal generator during a calibration process of the data interface. In some cases, such a signal may be the select signal input to serial port input pin 50*b* (as shown in FIGS. 5–7), in one example. Alternatively, such a signal may be the select signal input to parallel port input pin 120*a* (as shown in FIGS. 9–10), in another example.

In some embodiments, the method may be performed dynamically by transmitting and/or receiving portions of a synchronous system. As such, the method may include applying a logic value of the select signal, for example, to choose control values output from a control signal generator during a calibration process of the parallel data interface. In such an embodiment, the synchronous system may initiate the calibration process to determine a "best phase," which accurately samples each and every one of the plurality of data signals received by the parallel data interface. Such a calibration process may be described in more detail below in reference to FIG. 12.

In other embodiments, however, the method may be performed statically by a user of the synchronous system. As such, the method may include applying an opposite logic value of the select signal, for example, to choose predetermined control values upon an initial power-on sequence of the synchronous system. In some cases, the applied signal may select a predetermined "best phase," which is hardwired after an initial calibration process performed during a manufacturing step of the data interface. In other cases, the applied signal may select a predetermined "best phase," which is rewired after a subsequent calibration process performed by a user of the synchronous system. In any case, the calibration process may be performed as described below in reference to FIG. 12.

Alternatively, the signal may be applied for a predetermined amount of time to select a predetermined "best phase," in some cases. In the data interface of FIGS. 5 and 7, for example, the calibrate signal may be applied to serial port input pin 50*c* for a predetermined amount of time. As such, a timing correction may be performed statically by selecting the width of the calibrate signal to coincide with a "best phase" output from circular counter 72. In other cases, however, distinct values of the signal may be applied directly to input pins of a test access port to select the predetermined "best phase." In the data interface of FIGS. 9 and 10, for example, J number of calibration signals may be applied directly to parallel port input pins 120*b*. As such, a timing correction may be performed statically by encoding the J number of calibration signals into control signals that select the predetermined "best phase." In any case, the "best phase" may be predetermined by a calibration process, such as the calibration process described below in reference to FIG. 12.

Figure 12A:
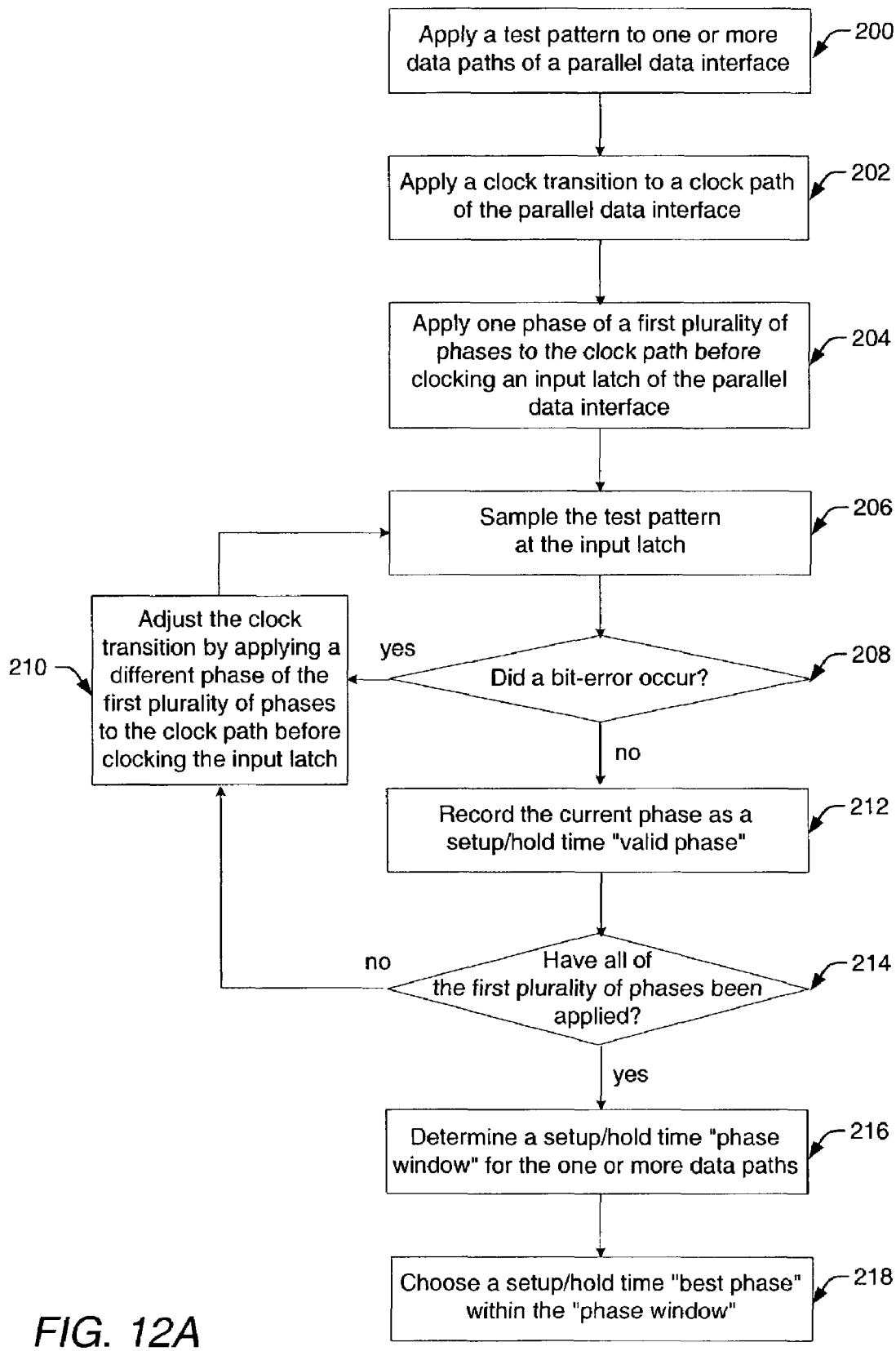
FIG. 12A is a flow chart diagram illustrating one embodiment of a calibration process of the parallel data interface.

FIG. 12A illustrates a calibration process that determines a "best phase" in which to sample a plurality of data signals after a minimum setup time threshold and before a minimum hold time threshold. In FIG. 12A, the calibration process includes applying a test pattern to one or more data paths of a parallel data interface (step 200). For example, a known test pattern may be applied as a plurality of data signals, data$_{in}$, to a plurality of data input pins (e.g., data input pins 32 of FIG. 5A, or data input pins 102 of FIG. 10A) of the data interface. In addition, the calibration process includes applying a clock transition to a clock path of the parallel data interface (step 202). For example, the clock transition may be reference clock signal, $clk_{in}$, applied to a clock input pin (e.g., clock input pin 34 of FIG. 5A, or clock input pin 102 of FIG. 10A) of the data interface. Furthermore, the calibration process may apply one phase of a first plurality of phases to the clock path before clocking an input latch of the parallel data interface (step 204). In some cases, the one phase may be the reference phase, $\phi_{ref}$. In other cases, however, the one phase may be any other phase within the plurality of phases generated by a phase generator, such as phase generator 38 of FIG. 5 or phase generator 108 of FIG. 10.

Subsequently, the calibration process samples the test pattern at the input latch of the data interface (step 206). Next, the calibration process determines whether or not the test pattern was accurately sampled. In other words, the calibration process is adapted to detect the occurrence of a bit-error (step 208) at the output of the data interface input latch. As such, the data interface preferably includes bit error detection circuitry, which is adapted to output an error violation signal to an output pin of the data interface upon detection of a bit error. In FIG. 5A, for example, data interface 30a includes bit error detection circuitry 52, which is adapted to provide an error violation signal to serial port test_out output pin 50e upon detection of a bit error. Likewise, data interface 100a of FIG. 10A includes bit error detection circuitry 122, which is adapted to provide an error violation signal to parallel port test_out output pin 120c upon detection of a bit error.

In general, bit-error detection circuitry may be implemented as a sequential or combinatorial logic block, however, a particular circuit implementation may vary depending on several factors. For example, the particular circuit implementation may depend on the number of data paths in the parallel data bus, the exact test pattern used in the calibration process, and the method by which the data paths are tested. In some cases, the bit-error detection circuitry may test each of the plurality of data paths separately, as illustrated in FIG. 10A. In other cases, the bit-error detection circuitry may test two or more of the data paths at a time. Alternatively, the bit-error detection circuitry may test substantially all of the data paths at once, as illustrated in FIG. 5A. In this manner, a circuit implementation of the bit-error detection circuitry may differ depending on the system in which the data interface is used, in some cases. In other cases, however, the bit-error detection circuitry may be implemented as a programmable logic device to improve the adaptability of the data interface to substantially any synchronous system.

After detection of a bit error (step 208), the calibration process adjusts the timing of the clock transition by applying a different phase of the first plurality of phases to the clock path before clocking the input latch (step 210). Next, the calibration process samples the test pattern with the adjusted clock transition (step 206) and determines whether or not a bit-error has occurred (step 208). If a bit error has occurred, the calibration process continues with steps 206–210. If a bit error is not detected, however, the currently applied phase is recorded as a "valid phase" (step 212). Subsequently, the calibration process determines whether or not substantially all of the first plurality of phases have been applied to the clock path (step 214). In some cases, e.g., when substantially all of the first plurality of phases have not been applied, the calibration process returns to step 210. In this manner, the calibration process continues with steps 206–214 until substantially all of the first plurality of phases have been applied.

Subsequently, the calibration process may determine a setup/hold time "phase window" for the one or more data paths (step 216). In general, a setup/hold time "phase window" includes one or more phases, which adjusts the clock transition to sample the test pattern without the occurrence of a bit error. In particular, the setup/hold time "phase window" may include the one or more phases recorded as "valid phases" in step 212 of the calibration process.

Finally, the calibration process includes choosing a setup/hold time "best phase" within the setup/hold time "phase window" (step 218). In general, the setup/hold time "best phase" may be referred to as a select one of the first plurality of phases (i.e., time delay pulses). In some cases, the select one of the first plurality of phases may be chosen as substantially any phase within the setup/hold time "phase window." For example, the select one of the first plurality of phases may be chosen as the middle phase within the setup/hold time "phase window." In other cases, however, the select one of the first plurality phases may be chosen as the phase, which provides the longest setup and hold times for substantially all of the plurality of data signals. Alternatively, the select one of the first plurality of phases may be chosen as the phase, which provides average setup and hold times closest to the setup and hold time specification values for a particular synchronous system.

Figure 12B:
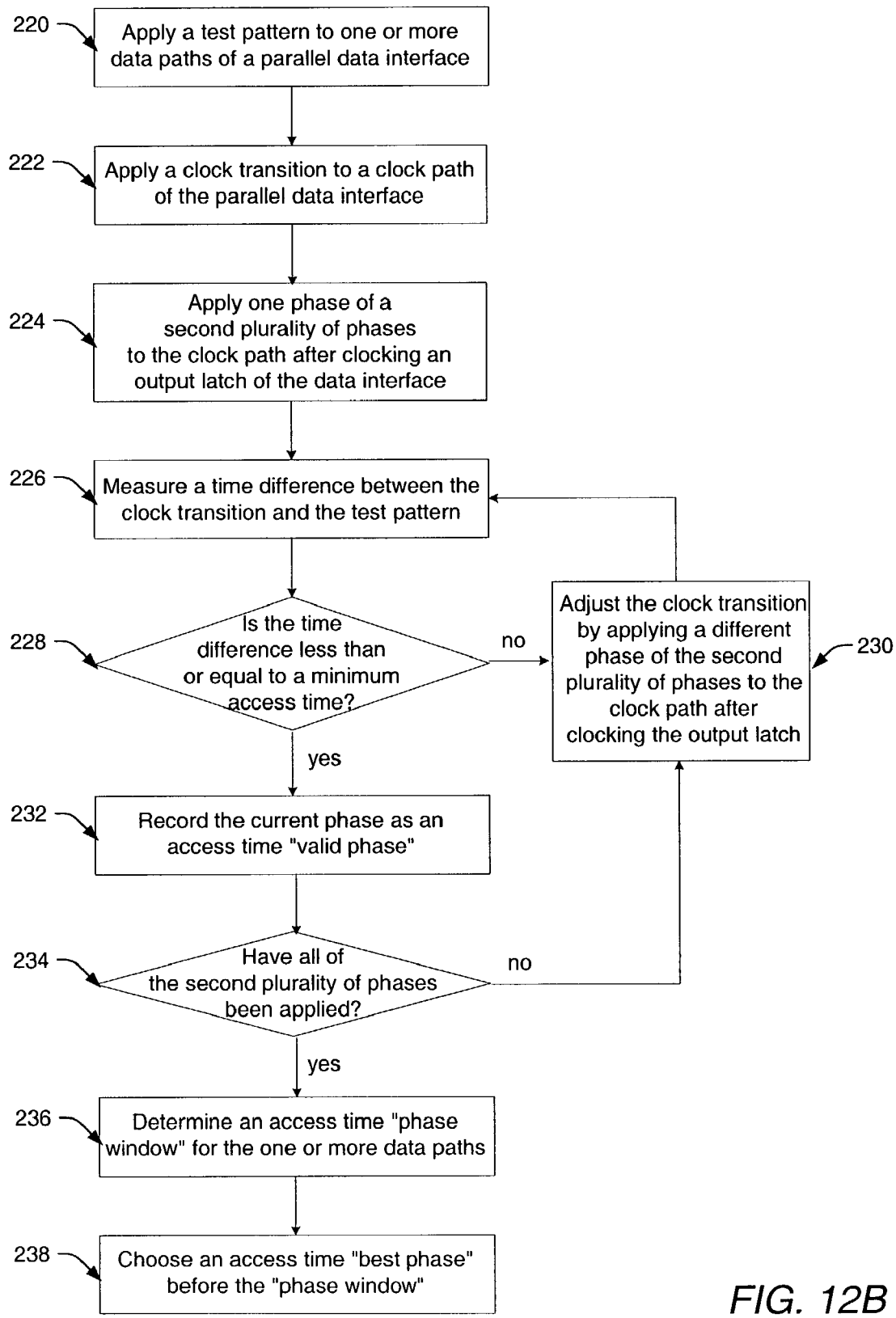
FIG. 12B is a flow chart diagram illustrating another embodiment of a calibration process of the parallel data interface.

FIG. 12B illustrates a calibration process that determines a best phase in which to provide the sampled data signals to output pins of the data interface after a minimum access time threshold. In some cases, a first portion of the data interface may be included within a transmitting portion, whereas a second portion of the data interface may be included within a receiving portion of the synchronous system. In such a case, the calibration process of FIG. 12B may be performed separately from the calibration process of FIG. 12A. Therefore, similar to FIG. 12A, the calibration process of FIG. 12B may include applying a test pattern to one or more data paths of a parallel data interface (step 220), and applying a clock transition to a clock path of the parallel data interface (step 222). Subsequently, the calibration process includes applying one phase of a second plurality of phases to the clock path after clocking an output latch of the data interface (step 224). In one example, the one phase may be reference phase, $\phi_{ref}$, of the reference clock signal. In another example, however, the one phase may be any other phase within a plurality of phases generated by a phase generator of the data interface.

In other cases, first and second portions of the data interface may be included within transmitting and receiving portions of the synchronous system. In such a case, the calibration process of FIG. 12B may be performed subsequent to performing the calibration process of FIG. 12A. As such, a known test pattern and clock transition may be previously applied in steps 200 and 202 of FIG. 12A. Therefore, the calibration process of FIG. 12B may begin with applying one phase of a second plurality of phases to the clock path after clocking an output latch of the data interface (step 224). As such, the one phase may be a setup/hold time "best phase," i.e., the select one of the first plurality of phases chosen in step 218 of FIG. 12A, in one example. In another example, however, the one phase may be any other phase within a plurality of phases generated by a phase generator of the data interface.

In any case, the calibration process continues by measuring a time difference between the clock transition and the test pattern. In general, a time difference can be measured between the clock transition and active transitions of the test pattern at output pins of the data interface. In FIG. 5B, for example, a time difference can be measured between the clock transition at clock output pin 60 and active transitions of the test pattern at data output pins 58. Similarly, a time difference can be measured between the clock transition at clock output pin 130 and active transitions of the test pattern at data output pins 128, as illustrated in FIG. 10B. In some cases, a time difference can be measured between the clock transition and each of the plurality of data paths separately, as illustrated in FIG. 10B. In other cases, a time difference can be measured between the clock transition and two or more of the data paths at a time. Alternatively, a time difference can be measured between the clock transition and substantially all of the data paths at once, as illustrated in FIG. 5B.

Subsequently, the calibration process determines if a time difference is substantially less than or equal to a minimum access time threshold (step 228). If the time difference is substantially greater than the minimum access time threshold, the calibration process adjusts the clock transition by applying a different phase of the second plurality of phases to the clock path after clocking the output latch (step 230). Next, the calibration process measures the time difference between the adjusted clock transition and the test pattern (step 226) and determines if the time difference is substantially less than or equal to a minimum access time threshold (step 228). If the time difference is still substantially greater than the minimum access time threshold, the calibration process continues with steps 226–230. If the time difference is substantially less than or equal to the minimum access time threshold, however, the currently applied phase is recorded as a "valid phase" (step 232). Subsequently, the calibration process determines whether or not substantially all of the second plurality of phases have been applied to the clock path (step 234). In some cases, e.g., when substantially all of the second plurality of phases have not been applied, the calibration process returns to step 230. In this manner, the calibration process continues with steps 226–234 until substantially all of the second plurality of phases have been applied.

Next, the calibration process determines an access time "phase window" for the one or more data paths (step 236). In general, an access time "phase window" includes one or more phases, which adjusts the clock transition to arrive less than a minimum access time before each and every one of the plurality of data signals. In particular, the access time "phase window" may include one or more phases recorded as "valid phases" in step 232 of the calibration process.

Finally, the calibration process includes choosing an access time "best phase" within the access time "phase window" (step 238). In general, the access time "best phase" may be referred to as a select one of the second plurality of phases (i.e., time delay pulses). In some cases, the select one of the second plurality of phases may be chosen as substantially any phase within the access time "phase window." For example, the select one of the second plurality of phases may be chosen as the middle phase within the access time "phase window." In other cases, however, the select one of the second plurality phases may be chosen as the phase, which provides the longest access time for substantially all of the plurality of data signals. Alternatively, the select one of the second plurality of phases may be chosen as the phase, which provides an average access time closest to an access time specification value for a particular synchronous system.

It will be appreciated to those skilled in the art having the benefit of this disclosure that this invention is believed to provide a parallel data interface and method for a synchronous system. In general, the parallel data interface and method provides a highly variable, though controllable, timing correction to a clock transition in order to accurately sample each and every one of a plurality of data signals. In particular, the parallel data interface and method provides error-free data transmission across a parallel data bus by adjusting the clock transition by a relative amount of phase delay, which allows each and every one of the plurality of data signals to be sampled within timing requirements of the synchronous system. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A data interface, comprising:
   a phase generator coupled to generate a plurality of time delay pulses;
   a phase selector adapted to select one of the plurality of time delay pulses to adjust a clock signal to sample each of a plurality of data signals having dissimilar transition times between transitions of the clock signal, wherein the phase selector comprises a control signal generator adapted to provide a control signal to the phase generator to select the one of the plurality of time delay pulses;
   a latch coupled to receive a clock transition adjusted by the select one of the plurality of time delay pulses;
   a second phase generator coupled to generate a second plurality of time delay pulses;
   a second control signal generator coupled to modify a number of the second plurality of time delay pulses and a time difference between neighboring second plurality of time delay pulses output from the second phase generator; and
   a plurality of data output pins coupled to receive the plurality of data signals from the latch.

2. The data interface circuit of claim 1, wherein an adjustable number of bits in the control signal determines a number of the plurality of time delay pulses and a time difference between neighboring time delay pulses.

3. The data interface circuit of claim 1, further comprising a test access port coupled to the control signal generator, wherein signals input to the test access port enable the control signal generator to begin a calibration process, or alternatively, to provide previously calibrated control signals to the phase selector.

4. The data interface circuit of claim 3, wherein the test access port is a serial port comprising at least one input pin of the data interface.

5. The date interface circuit of claim 3, wherein the test access port is a parallel port comprising a plurality of input pins of the data interface.

6. The data interface of claim 1, wherein the second control signal generator is adapted to select, one at a time, a different one of the second plurality of time delay pulses to be applied to a clock output pin of the data interface.

7. The data interface of claim 6, wherein a time difference is measured between a transition of the different one of the second plurality of time delay pulses and a transition of at least one of the plurality of data signals, and wherein the time difference determines a select one of the second plurality of time delay pulses to adjust the timing of a clock transition coupled to the clock output pin, such that each and every one of the plurality of data signals arrive at respective data output pins after at least an access time threshold.

8. A data interface, comprising:
a first phase generator coupled to generate a first plurality of time delay pulses;
a first control signal generator coupled to modify a number of the first plurality of time delay pulses and a time difference between neighboring first plurality of time delay pulses output from the first phase generator;
a latch coupled to receive a clock transition adjusted by a select one of the first plurality of time delay pulses for sampling each and every one of a plurality of data signals input to the latch;
error detection circuitry adapted to provide an error signal to an output pin of the data interface when a logic value of at least one of the plurality of data signals output from the latch does not equal a logic value of the at least one of the plurality of data signals input to the latch;
a second phase generator coupled to generate a second plurality of time delay pulses;
a second control signal generator coupled to modify a number of the second plurality of time delay pulses and a time difference between neighboring second plurality of time delay pulses output from the second phase generator; and
a plurality of data output pins coupled to receive the plurality of data signals from the latch.

9. The data interface of claim 8, wherein the select one of the first plurality of time delay pulses adjusts the timing of the clock transition, such that each and every one of the plurality of data signals are sampled after a setup time threshold and before a hold time threshold.

10. The data interface of claim 8, wherein the first control signal generator is adapted to sequentially select each one of the first plurality of time delay pulses until the select one of the first plurality of time delay pulses does not cause the error detection circuitry to produce the error signal.

11. The data interface of claim 8, wherein the first control signal generator is adapted to programmably select a different one of the first plurality of time delay pulses until the select one of the first plurality of time delay pulses does not cause the error detection circuitry to produce the error signal.

12. The data interface of claim 8, wherein the second control signal generator is adapted to select, one at a time, a different one of the second plurality of time delay pulses to be applied to a clock output pin of the data interface.

13. The data interface of claim 12, wherein a time difference is measured between a transition of the different one of the second plurality of time delay pulses and a transition of at least one of the plurality of data signals, and wherein the time difference determines a select one of the second plurality of time delay pulses to adjust the timing of a clock transition coupled to the clock output pin, such that each and every one of the plurality of data signals arrive at respective data output pins after at least an access time threshold.

* * * * *